(12) United States Patent
Mi et al.

(10) Patent No.: US 11,804,570 B2
(45) Date of Patent: Oct. 31, 2023

(54) CORE-SHELL INGAN/ALGAN QUANTUM NANOWIRE PHOTONIC STRUCTURES

(71) Applicant: THE REGENTS OF THE UNIVERSITY OF MICHIGAN, Ann Arbor, MI (US)

(72) Inventors: Zetian Mi, Ann Arbor, MI (US); Yong-Ho Ra, Montreal (CA); Roksana Rashid, Montreal (CA); Xianhe Liu, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/044,337

(22) Filed: Jul. 24, 2018

(65) Prior Publication Data

US 2019/0148583 A1    May 16, 2019

Related U.S. Application Data

(60) Provisional application No. 62/536,449, filed on Jul. 24, 2017.

(51) Int. Cl.
| | |
|---|---|
| *H01L 33/06* | (2010.01) |
| *H01L 33/32* | (2010.01) |
| *H01L 33/00* | (2010.01) |
| *G02B 6/122* | (2006.01) |
| *H01L 33/18* | (2010.01) |
| *H01S 5/343* | (2006.01) |
| *H01S 5/34* | (2006.01) |
| *H01S 5/11* | (2021.01) |

(52) U.S. Cl.
CPC ............ *H01L 33/06* (2013.01); *G02B 6/1225* (2013.01); *H01L 33/007* (2013.01); *H01L 33/18* (2013.01); *H01L 33/32* (2013.01); *H01S 5/11* (2021.01); *H01S 5/341* (2013.01); *H01S 5/3412* (2013.01); *H01S 5/34333* (2013.01)

(58) Field of Classification Search
USPC .......................................................... 257/14
See application file for complete search history.

(56) References Cited

U.S. PATENT DOCUMENTS

| | | | | |
|---|---|---|---|---|
| 9,106,056 B1* | 8/2015 | Hersee | ................ | H01L 25/167 |
| 2013/0240348 A1* | 9/2013 | Mi | .................... | H01L 21/02639 |
| | | | | 204/157.5 |
| 2014/0286369 A1* | 9/2014 | Katz | ...................... | H01L 33/42 |
| | | | | 372/45.012 |
| 2016/0027961 A1* | 1/2016 | Mi | ........................ | H01L 33/06 |
| | | | | 257/13 |
| 2016/0365480 A1* | 12/2016 | Mi | ........................ | H01L 33/32 |

* cited by examiner

*Primary Examiner* — Walter H Swanson

(57) ABSTRACT

A nanowire can include a first semiconductor portion, a second portion including a quantum structure disposed on the first portion, and a second semiconductor portion disposed on the second portion opposite the first portion. The quantum structure can include one or more quantum core structures and a quantum core shell disposed about the one or more quantum core structures. The one or more quantum core structures can include one or more quantum disks, quantum arch-shaped forms, quantum wells, quantum dots within quantum wells or combinations thereof.

14 Claims, 27 Drawing Sheets

610

610

610

610

CORE-SHELL INGAN/ALGAN QUANTUM NANOWIRE PHOTONIC STRUCTURES

CROSS-REFERENCE TO RELATED APPLICATIONS

This Application claims the benefit of U.S. Provisional Patent Application No. 62/536,449 filed Jul. 24, 2017, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing devices and other electronics are displays based on Light-Emitting Diodes (LEDs).

Scalable and efficient light emitting photonic devices are needed for a broad range of applications including lighting, display, communication, sensing, imaging and medical diagnostics. While Gallium Nitride (GaN) based Light Emitting Diodes (LEDs) exhibit efficient operation in the blue wavelength range, their efficiency and stability degrade considerably with increasing wavelength, leading to a "green gap" in LED and laser technologies. The quantum efficiency parameter η of a semiconductor light emitter can be determined by Equation 1:

$$\eta \propto \frac{\tau_r^{-1}}{\tau_r^{-1} + \tau_{nr}^{-1}} \quad (1)$$

wherein the two parameters $\tau_r$ and $\tau_{nr}$ represent the radiative and nonradiative lifetime in the device action region respectively. In conventional Indium Gallium Nitride/Gallium Nitride (InGaN/GaN) green and amber LEDs, the presence of large densities of defects and dislocations, due to the large lattice mismatch of approximately 11% between InN and GaN, and Auger recombination leads to a small $\tau_{nr}$ and therefore low quantum efficiency. Moreover, the performance of conventional InGaN light emitters suffers from strain-induced polarization fields and the resulting quantum-confined Stark effect, which often results in a considerable blueshift in emission wavelengths (up to 30 nm) under high power operation. To date, a clear path to achieve efficient and stable semiconductor light emitters operating in the green, yellow, and amber wavelengths has remained elusive.

Emission properties of a semiconductor light emitter can be determined not only by the properties of the device active medium but also by the optical density of states surrounding the active region. For example, by exploiting the Purcell effect in an optical microcavity, the radiative lifetime $\tau_r$ can be significantly reduced, thereby leading to an enhancement of the internal quantum efficiency which is denoted by the parameter η. To date, however, there has been few demonstrations on the use of Purcell effect to bridge the "green gap" in semiconductor LEDs and lasers. The Purcell factor, Fp, is determined by Equation 2:

$$F_p \propto \frac{Q_g}{V} \quad (2)$$

wherein Q is the quality factor, V is the mode volume of the optical cavity, and g is the mode degeneracy. To enhance the Purcell factor, conventional design considerations are focused on small optical cavity size (on the order of micron meter), whereas practical LED devices require extended optical mode spread over millimeter scale (i.e. three to six orders of magnitude larger than conventional designs). In addition, previously reported GaN optical cavities, including photonic crystals, are generally fabricated from crystalline epilayers using the top-down etching method, which inherently have large densities of defects and dislocations, with emission wavelengths limited to the blue and near-ultraviolet spectral range. Accordingly, there is a continuing need for improved optoelectronic devices.

SUMMARY OF THE INVENTION

The present technology may best be understood by referring to the following description and accompanying drawings that are used to illustrate embodiments of the present technology directed toward core/shell quantum nanowire phototonic structures.

In one embodiment, a nanowire can include a first group III-V compound semiconductor with a first type of doping. One or more quantum core structures and a quantum shell structure disposed about the one or more quantum core structures can be disposed on the first group III-V compound semiconductor with the first type of doping. A second group III-V compound semiconductor with a second type of doping can be disposed on the portion including the one or more quantum core structures with quantum shell structure disposed about the quantum core structures.

In another embodiment, a device can include one or more clusters of nanowires. The nanowires can include a first semiconductor region, a core-shell quantum structure, and a second semiconductor region. The core-shell quantum structure can include one or more quantum core structures and a quantum shell structure disposed about the one or more quantum core structures. The one or more quantum core structures can include one or more alternating layers of Indium Gallium Nitride (InGaN) layers and one or more layers of Aluminum Gallium Nitride (AlGaN). The quantum shell structure can include AlGaN or Aluminum-rich Gallium Nitride (GaN). The first semiconductor region can include n-type doped Gallium Nitride (GaN), and the second semiconductor region can include p-type doped Gallium Nitride (GaN).

In another embodiment, a method of fabricating a nanowire can include forming by Selective Area Growth (SAG) a first semiconductor nanowire region with a first type of doping. A quantum structure can be formed by SAG on the first semiconductor nanowire region. The quantum structure can include one or more quantum core structures and a quantum shell structure disposed about a periphery of the one or more quantum core structures. A second semiconductor nanowire region with a second type of doping can be formed by SAG on the quantum structure.

In yet another embodiment, a method of fabricating a device including one or more clusters of nanowires can include forming a nano-pattern layer including one or more cluster of openings on a substrate. A first semiconductor region with a first type of doping can be formed in the one or more cluster of openings in the nano-pattern layer. The first semiconductor region can be formed by epitaxially depositing n-type doped Gallium Nitride (GaN). A quantum structure can be formed on the first semiconductor region. The quantum structure can include one or more quantum core structures and a quantum shell structure disposed about a the one or more quantum core structures. The one or more quantum core structures can be formed by alternatively epitaxially depositing one or more layers of Indium Gallium Nitride (InGaN) and one or more layer of Aluminum Gallium Nitride (AlGaN). The epitaxial deposition of Aluminum Gallium Nitride (AlGaN) on the Indium Gallium Nitride (InGaN) also results in the formation of the quantum shell structure that includes Aluminum Gallium Nitride (AlGaN) or Aluminum-rich Gallium Nitride (GaN). A second semiconductor region with a second type of doping can be firmed on the quantum structure. The second semiconductor region can be formed by epitaxially depositing p-type doped Gallium Nitride (GaN).

In accordance with aspects of the present technology, devices formed of InGaN can be synthesized via a bottom-up method, wherein the formation of defects and dislocations are minimized due to the efficient surface strain relaxation. With the use of selective area epitaxy, the size, spacing and morphology of InGaN nanowire structures (including dot-in-nanowires, nanotriangles and nano-rectangles, for example) can be precisely controlled, and, as such, spatially extended band edge modes can develop over a large area of such defect-free photonic crystals. The present techniques can form InGaN-based light emitters where there is an absence of Varshni and quantum-confined Stark, factors that contribute significantly to the efficiency drop and device instability under high power operation that plagues convention light emitters. The resulting devices have distinct emission properties that stem directly from the highly-stable and scalable hand edge modes of the InGaN photonic crystalline structures, in particular due to the precisely controlled size, position, and morphology of InGaN photonic molecules. The resulting devices can be applied for varied LED and laser operations, including, in particular, uncooled, high efficiency operation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
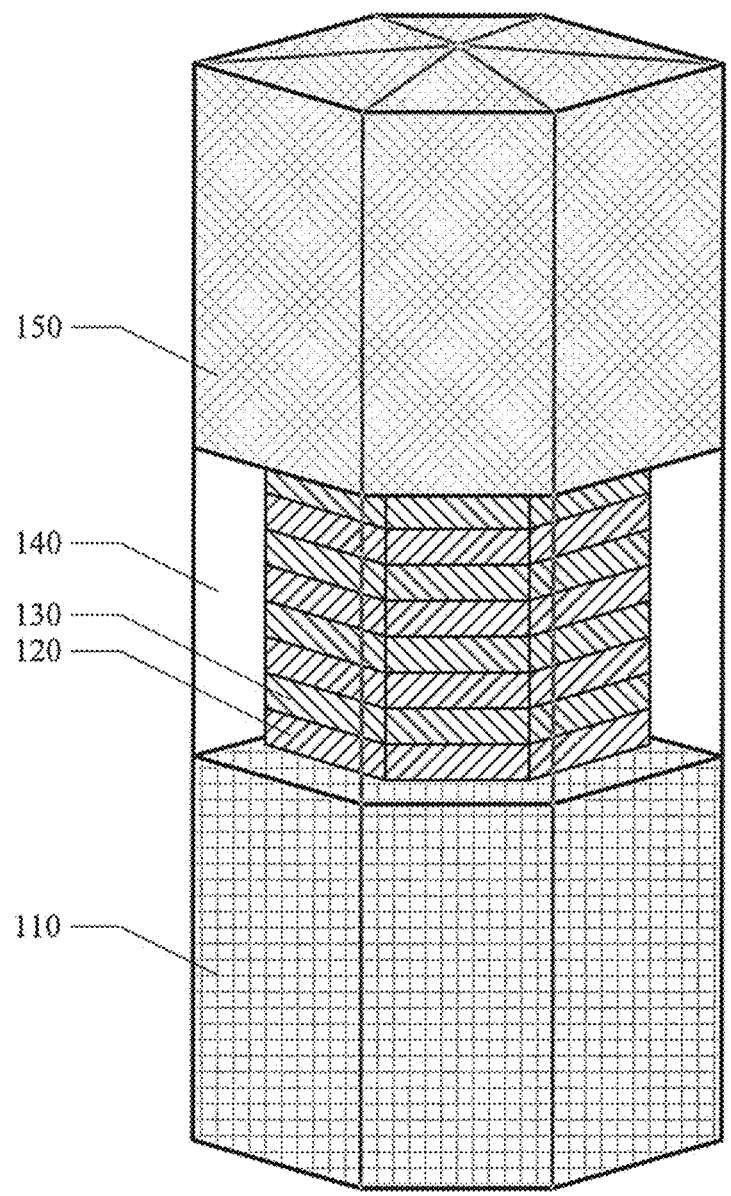
FIG. 1 shows a nanowire, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other, instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

FIG. 1 shows a nanowire, in accordance with aspects of the present technology. The nanowire 100 can include a first semiconductor region 110, a core-shell quantum structure 120-140 disposed on the first semiconductor region 110, and a second semiconductor region 150 disposed on the core-shell quantum structure 120-140 opposite the first semiconductor region 110. In one implementation, the first semiconductor region 110 can include a group III-V compound semiconductor with a first type of doping, such as n-dope Gallium Nitride (GaN). The second semiconductor region 150 can include a group III-V compound semiconductor with a second type of doping, such as p-doped GaN. In aspects, the nanowire 100 can have a substantially hexagonal, square, rectangular, rhombic, polygonal, circular or elliptical cross-sectional shape.

In aspects, the core-shell quantum structure 120-140 can include one or more quantum core structures 120, 130, and a quantum shell structure 140 disposed about a periphery of the one or more quantum core structures 120, 130. The one or more quantum core structures 120, 130 can include one or more quantum disks, quantum arch-shaped forms, quantum wells, quantum dots within quantum wells or combinations thereof. The core-shell quantum structure can include one or more alternating quantum active regions 120 and quantum barrier regions 130. In one implementation, the one or more quantum core structures 120, 130 can include one or more alternating layers of Indium Gallium Nitride (InGaN) and Aluminum Gallium Nitride (AlGaN) 130. For example, a first layer of InGaN 120 can be disposed on the n-doped GaN of the first semiconductor region 110, and a first layer of AlGaN 130 disposed on the first layer of InGaN 120. A second layer of InGaN can be disposed on the first layer of AlGaN 130, and a second layer of AlGaN can be disposed on the second layer of InGaN. The layers of InGaN and AlGaN can be alternately repeated to form a predetermined number of quantum core structures. In an exemplary implementation, the nanowire 110 can include ten quantum core structures formed by ten layers of InGaN interleaved with ten layers of AlGaN. In one implementation, the quantum shell structure 140 can include AlGaN or Aluminum-rich Gallium Nitride disposed about the alternating layers of InGaN and AlGaN of the one or more quantum core structures 120, 130. An AlGaN compound semiconductor can be used to achieve a nanowire having ultraviolet wavelengths of emission. In another implementation, the one or more quantum barrier regions 130 can include Indium Gallium Arsenide (InGaAs) to achieve a nanowire having infrared wavelengths of emission. In yet another implementation, the one or more quantum barrier regions 130 can include Indium Arsenide (InAs) to achieve a nanowire having mid-infrared wavelengths of emission.

Figure 2:
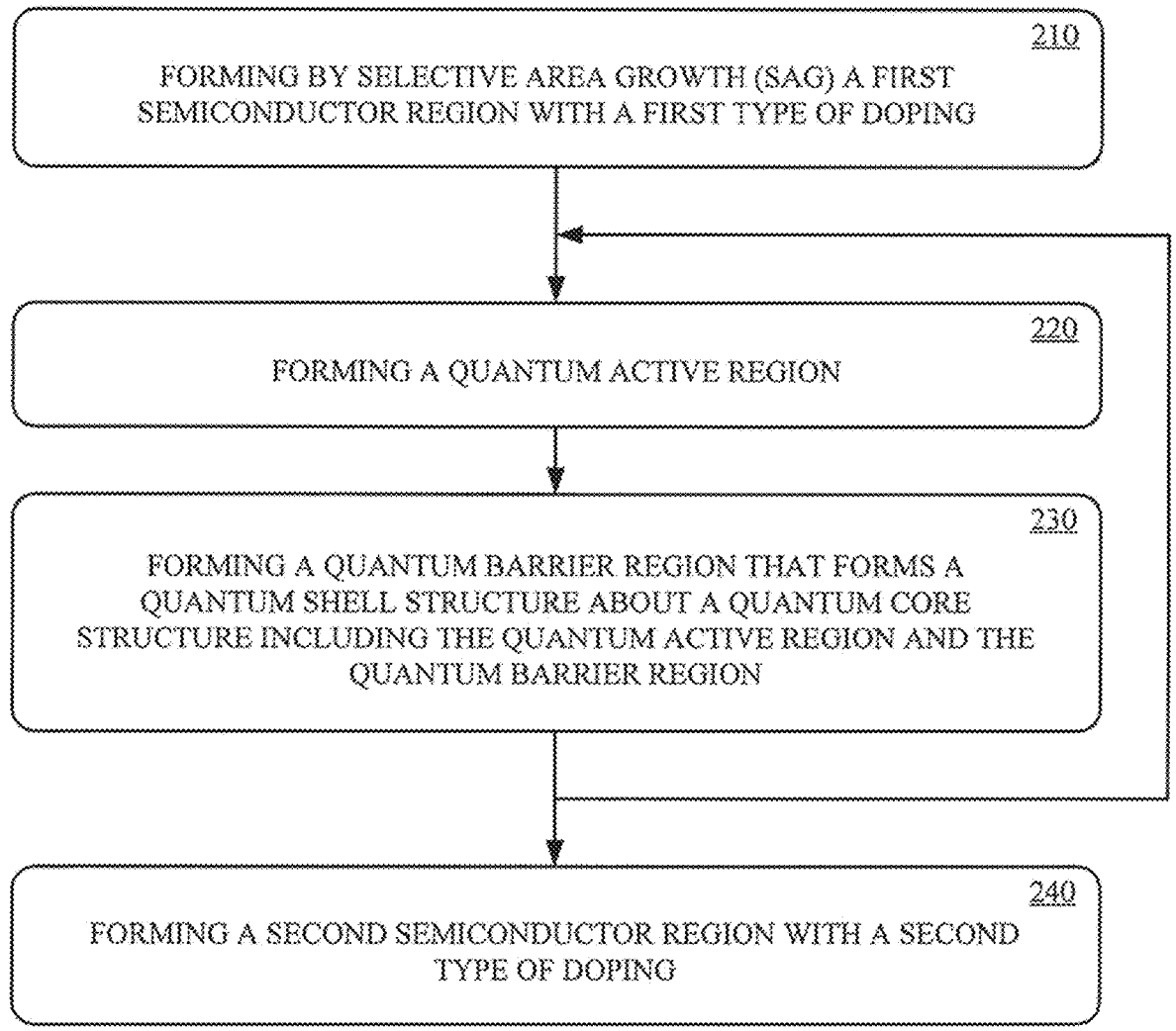
FIG. 2 shows a method of fabricating a nanowire, in accordance with aspects of the present technology.

Referring now to FIG. 2 a method of fabricating a nanowire, in accordance with aspects of the present technology, is shown. The method of fabricating the nanowire can include forming a first portion of the nanowire 110 (also referred to as a lower portion) including a group III-V compound semiconductor with a first type of doping on a substrate, at 210. In one implementation, the group III-V compound semiconductor with the first type of doping can be n-dope Gallium Nitride (GaN). The substrate can be a Silicon Carbide (SiC) substrate, a Gallium Nitride (GaN) substrate, a Silicon Oxide (SiOx) substrate, a Sapphire substrate, an Aluminum Oxide (AlOx) substrate, a quartz substrate, a metal substrate, or a combination thereof. In one implementation, the group III-V compound semiconductor with the first type of doping can be formed by selective area epitaxy of the group III-V compound semiconductor with the first type of doping on the substrate. For example, the lower portion of the nanowire 110 can be formed by selective area epitaxy of GaN with Silicone (Si) doping (e.g., n-doping) on top of a nano-patterned substrate using plasma assisted Molecular Beam Epitaxy (MBE) to form the lower portion of the nanowire 110 with a cross-sectional width (also referred to a lateral size) of approximately 200 nm and a height of approximately 380 to 460 nanometers (nm). The growth conditions for the Si-doped GaN can include a grow temperature of approximately 800 degrees Centigrade (° C.), with a nitrogen flow rate of approximately 0.6 standard cubic centimeter per minute (sccm), a forward plasma power of approximately 350 Watts (W), and a Ga Beam Equivalent Pressure (BEP) of approximately 3.5×10$^{-7}$ Torr.

The method of fabrication can include forming a core-shell quantum structure including one or more quantum structures and a shell quantum structure. At 220, a first quantum active region 120 can be formed. In one implementation, Indium Gallium Nitride (InGaN) can be formed by selective area epitaxy on the Silicone doped GaN to form the first quantum active region 120 with a height of approximately 5 nm. The InGaN can be deposited using plasma assisted MBE, wherein the growth conditions can include a substrate temperature of approximately 600° C., a Ga BEP of approximately 9×10$^{-9}$ Torr and In BEP of approximately 7.5×10$^{-8}$.

At 230, a first quantum barrier region 130 can be deposited. In one implementation, Aluminum Gallium Nitride (AlGaN) can be formed by selective area epitaxy on the InGaN for form the first quantum barrier region 130 with a height of approximately 5 nm. For example, the AlGaN can be deposited using plasma assisted MBE, wherein the growth conditions can include a substrate temperature of approximately 600° C., a Ga BEP of approximately 9×10$^{-9}$ Torr, and Al BEP of approximately 4.5×10$^{-9}$. The incorporation of AlGaN in the quantum barrier region 130 leads to the formation of an AlGaN or Aluminum-rich GaN shell surrounding the one or more InGaN quantum active regions due to the smaller Al adatom migration length compared to Ga and In adatoms.

An AlGaN compound semiconductor can be used for the quantum barrier region 130 to achieve a nanowire having, ultraviolet wavelengths of emission. In another implementation, the quantum barrier region 130 can include Indium Gallium Arsenide (InGaAs) to achieve a nanowire having infrared wavelengths of emission. In yet another implementation, the quantum barrier region 130 can include Indium Arsenide (InAs) to achieve a nanowire having mid-infrared wavelengths of emission.

The processes at 220 and 230 can be performed one or more times to form the second portion of the nanowire. For example, the processes at 220 and 230 can be iteratively performed ten times to form a second portion of the nanowire including ten quantum core structures and a quantum shell structure disposed about the periphery of the ten quantum core structures.

At 240, a second portion of the nanowire 150 (also referred to as an upper portion) including a group III-V compound semiconductor with a second type of doping can be formed. In one implementation, the group III-V compound semiconductor with the first type of doping can be p-dope Gallium Nitride (GaN). The group III-V compound semiconductor with the second type of doping can be deposited by selective area epitaxy. For example, supper portion of the nanowire 150 can be formed by selective area epitaxy of GaN with Magnesium (Mg) doping (e.g., p-doping) on top of a quantum barrier region and surrounding quantum shell structure 140 using plasma assisted Molecular Beam Epitaxy (MBE) to form the upper portion of the nanowire 150 with height of approximately 30 to 80 nm. The growth conditions for the Mg-doped GaN can include a Ga BEP of approximately 3.5×10$^{-7}$ Torr, a Mg BEP of approximately 2×10 and a substrate temperature of approximately 750 T.

The incorporation of AlGaN in the one or more quantum barrier regions 130 of the core-shell quantum structure 120-140, instead of GaN barriers as used in the conventional art, advantageously leads to the formation of the AlGaN quantum shell structure 140 surrounding the quantum core structure 120, 130. This particular core-shell quantum structure 120-140 formation process is due to the smaller Al adatom migration length compared to Ga and In adatoms. The resulting core-shell quantum structure 120-140 can advantageously suppress non-radiative surface recombination resulting an enhanced luminescence intensity and luminescence efficiency of the nanowire 100.

Figure 3:
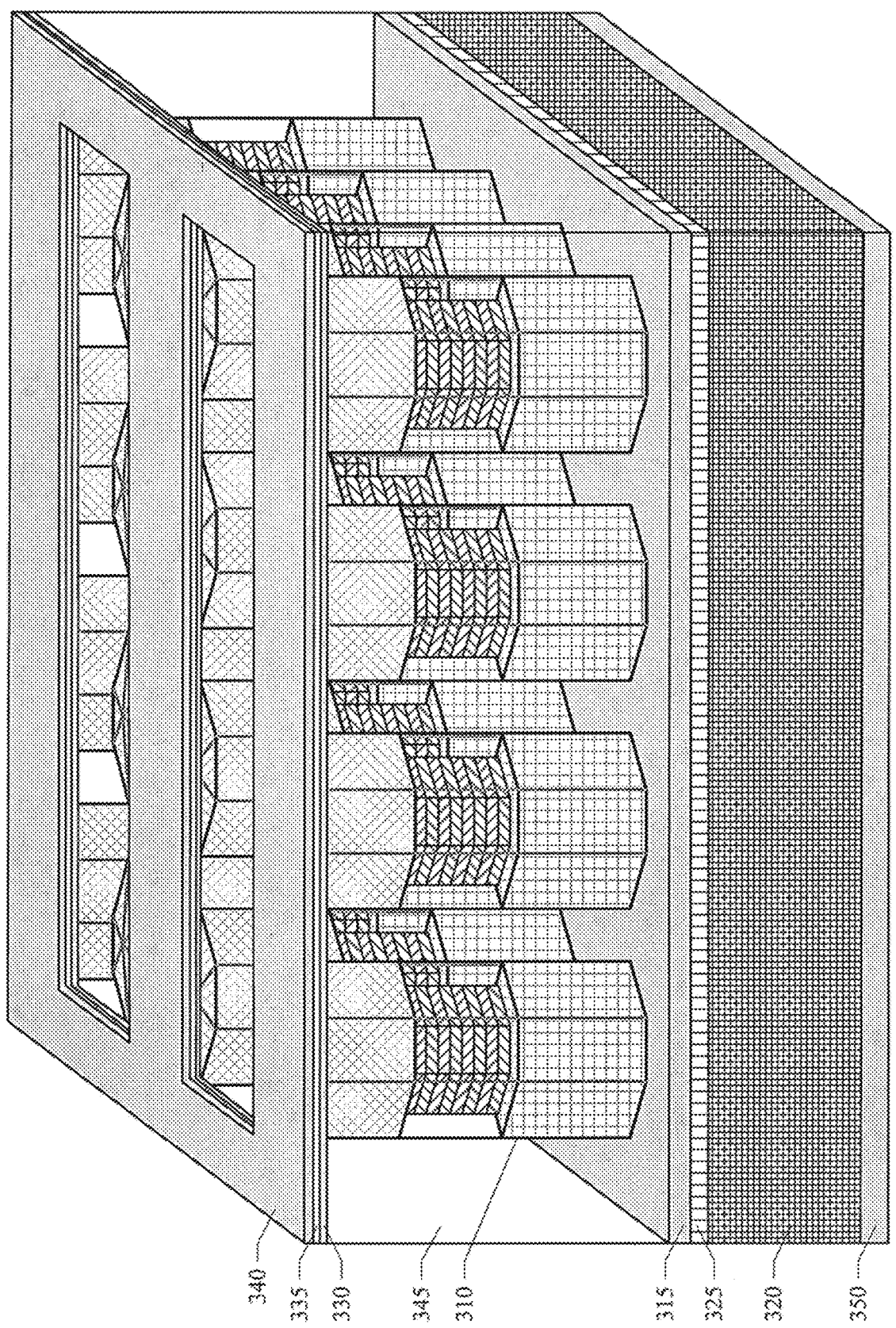
FIG. 3 shows a nanowire device, in accordance with aspects of the present technology.

Referring now to FIG. 3, a nanowire device, in accordance with aspects of the present technology, is shown. The nanowire device 300 can include one or more clusters of nanowires 310 disposed on a nano-patterned substrate 315-325. The nanowires 310 can have a structure as described above with regard to FIG. 1.

In one implementation, the nano-patterned substrate 315-325 can include a nano-pattern layer 315 including one or more clusters of openings disposed on a substrate 320. Optionally, a nucleation layer 325 can be disposed between the nano-pattern layer 315 and the substrate 320. In one implementation, the nano-pattern layer 315 can include Titanium (Ti), Silicon Nitride (SiNx), Silicon Oxide (SiOx), or the like. The substrate 320 can be a Silicon (Si) substrate, a Silicon Carbide (SiC) substrate, a Gallium Nitride (GaN) substrate, a Silicon Oxide (SiOx) substrate, a Sapphire substrate, an Aluminum Oxide (AlOx) substrate, an Aluminum Nitride (AlN) substrate, a quartz substrate, a metal substrate, or a combination thereof. The optional nucleation layer 325 can include Gallium Nitride (GaN), Aluminum Nitride (AlN), SiNx, Gallium Arsenide (GaAs) or the like. The one or more clusters of nanowires 310 can be disposed on the substrate 320 through the one or more clusters of openings in the nano-pattern layer 315. The nucleation layer 325 can be configured to promote a crystalline structure in the group III-V compound semiconductor with a first type of doping of the lower portion of the nanowire 110.

The nanowire device 300 can also include one or more first contacts 330-340 that can be disposed on the one or more cluster of nanowires 310 opposite the substrate 315-325. In one implementation, a plurality of first contacts 330-340 can be configured to couple to different clusters of nanowires 300. For example, FIG. 3 illustrates a single first contact 330-340 configured to be coupled to a cluster of twelve nanowires 310. The device can include one or more sets of clusters of nanowires 310 with corresponding separate first contacts 330-340. In one implementation, the one or more first contacts 330-340 can include a first layer 330 of Nickle (Ni), Gold (Au) and/or NiAu alloys thereof, a second layer 335 of Indium Tin Oxide (ITO) disposed on the first layer 330 and coupled to the plurality of nanowires 310, and a third layer 340 of Nickle (Ni), Gold (Au) and/or NiAu alloys thereof disposed on the second layer 334. The second layer 335 of ITO can be configured to permit light to pass through. The first and third layers 330, 340 can be configured to make good ohmic contact with the nanowires 310 through the second layer 335, and can include one or more windows to permit light to pass through. The nanowires, device 300 can further include an optically transmissive layer 345 disposed about the one or more clusters of nanowires 310 between the substrate 315-325 and the one or more first contacts 330-340. In one implementation, the optically transmissive layer 345 can be a polyimide. One or more second contacts 350 can be disposed on the substrate 315-325 opposite the one or more clusters of nanowires 310. The one or more second contacts 350 can be electrically coupled to the nanowires 310 through the substrate 315-325. In one implementation, the one or more second contacts 350 can include one or more layers of Titanium (Ti), Gold (Au) and/or TiAu alloys thereof. The substrate 320 can be a heavily n-doped silicon (Si) substrate to make a good ohmic contact between the second contact 350 and the one or more clusters of nanowires 310.

Figure 4A:
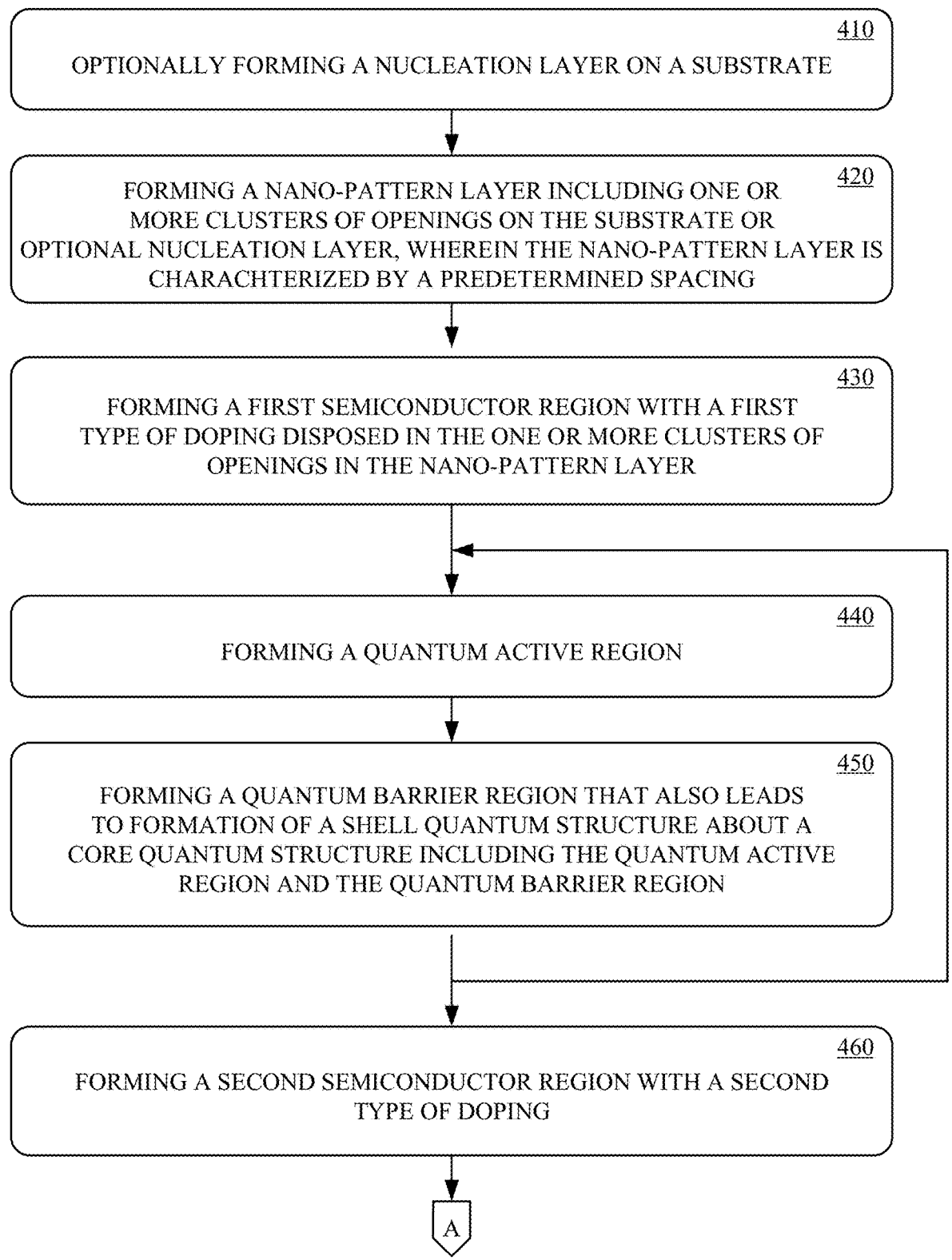
FIGS. 4A and 4B show a method of fabricating a nanowire device, in accordance with aspects of the present technology.
Figure 4B:
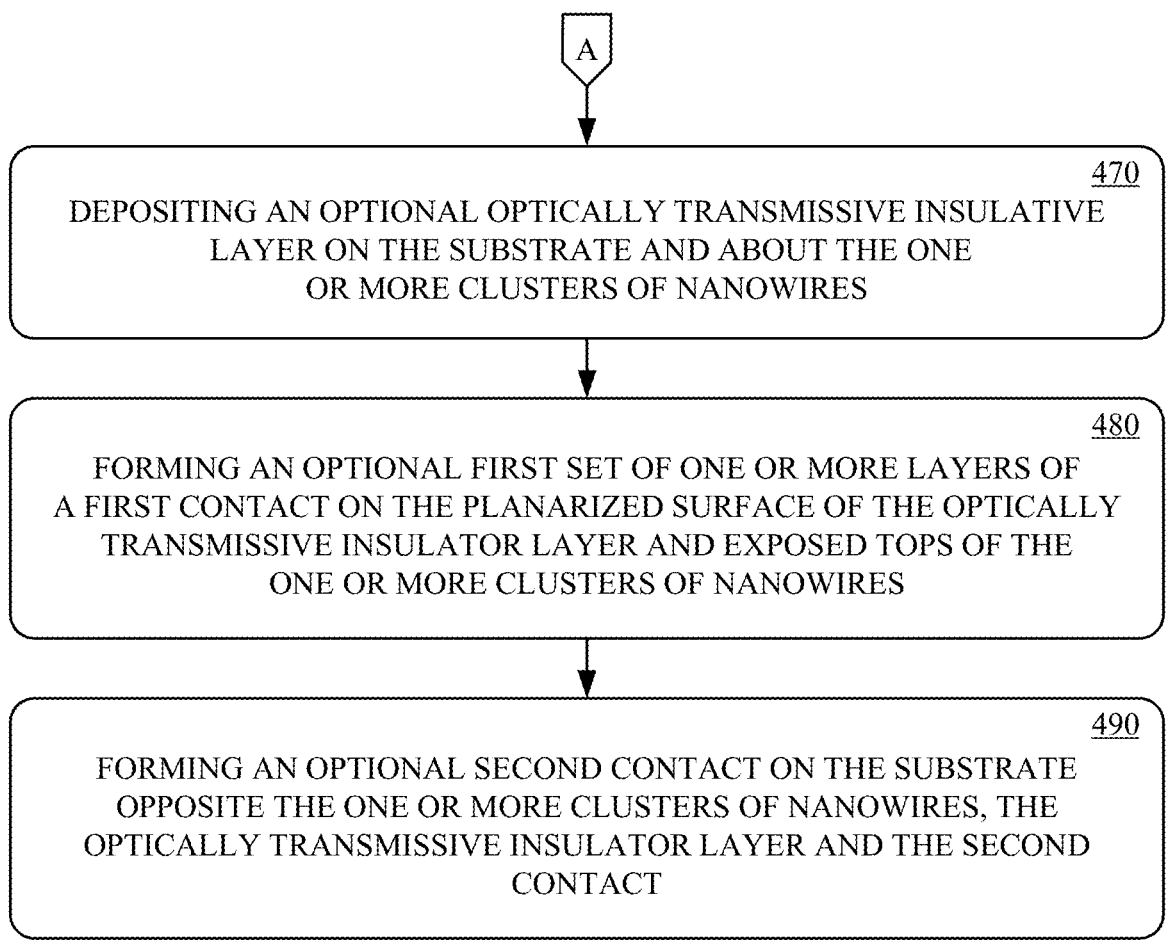

Referring now to FIGS. 4A and 4B, a method of fabricating a nanowire device, in accordance with aspects of the present technology, is shown. The method of fabrication can include optionally forming a nucleation layer on a substrate, at 410. In one implementation, the substrate can be a Silicon (Si) substrate, a Silicon Carbide (SiC) substrate, a Gallium Nitride (GaN) substrate, a Silicon Oxide (SiOx) substrate, a Sapphire substrate, an Aluminum Oxide (AlOx) substrate, an Aluminum Nitride (AlN) substrate, a quartz substrate, a metal substrate, or a combination thereof. The optional nucleation layer 325 can include Gallium Nitride (GaN), Aluminum Nitride (AlN), SiNx, Gallium Arsenide (GaAs) or the like. In one implementation a layer of GaN approximately 4 micrometers (μm) can be deposited on an $Al_2O_3$ (0001) substrate by and e-beam evaporative deposition process.

At 420, a nano-pattern layer including one or more clusters of openings can be formed on the substrate or if applicable the optional nucleation layer. The nano-pattern layer can be characterized by a predetermined spacing. In one implementation, a layer of Titanium (Ti), or other materials such as Silicon Nitride (SiNx) or Silicon Oxide (SiOx), can be deposited. A polymethyl methacrylate (PMMA) layer can be deposited and pattern by an e-beam lithography process to include one or more clusters of openings. The portions of the Ti layer exposed by the patterned PMMA layer can be etched using a reactive dry etching technique to form a Ti layer including one or more cluster of openings. The patterned Ti layer can be subject to a surface nitridation for approximately 10 minutes at 400° C. The exposed portions of the substrate or optional nucleation layer exposed by the patterned Ti layer can be cleaned by Hydrogen Chloride (HCl.)

Figure 5:
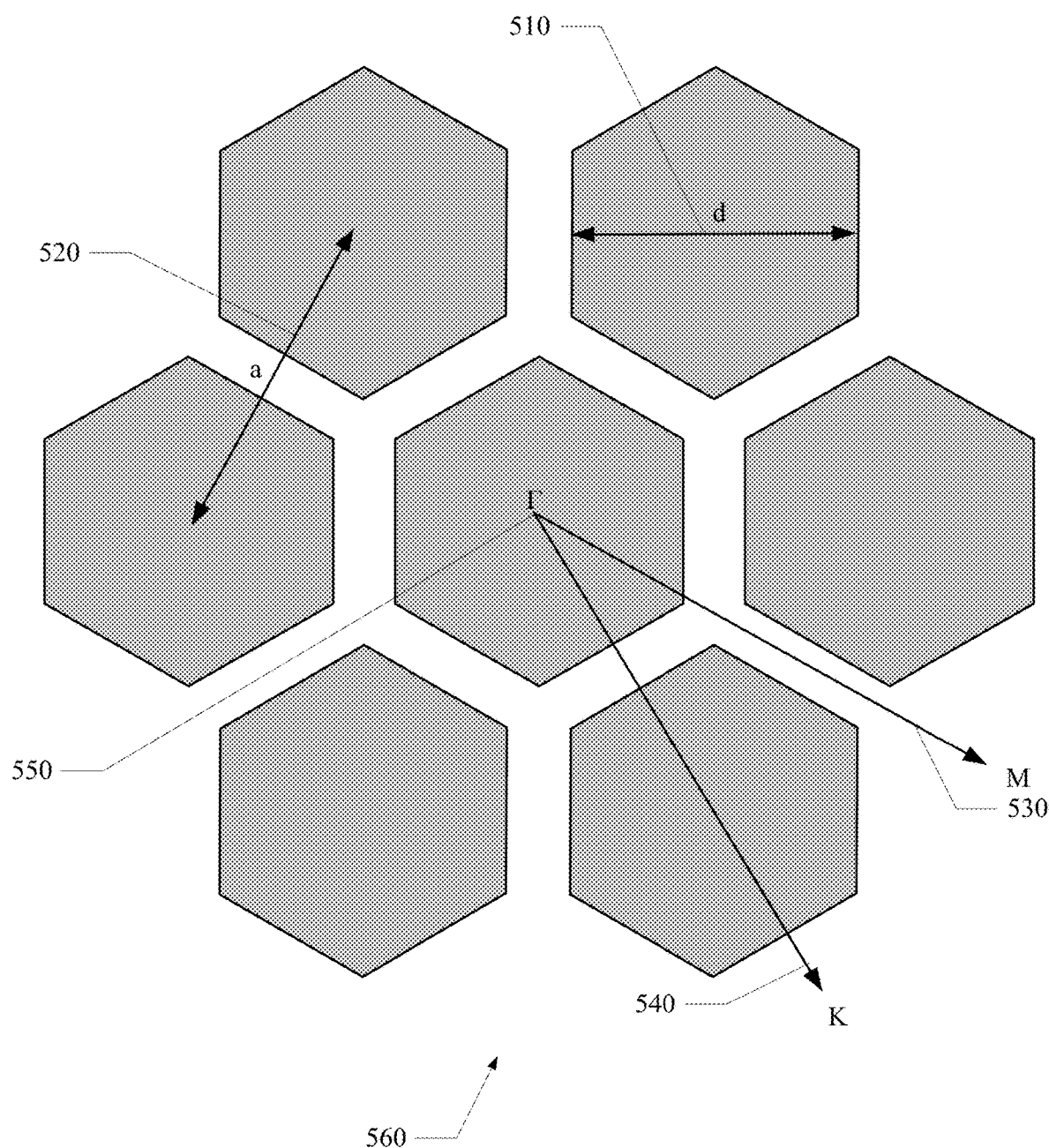
FIG. 5 shows an exemplary nano-pattern, in accordance with aspects of the present technology.
Figure 6A:
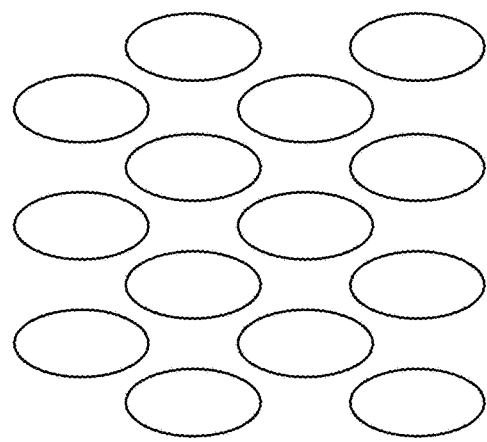
FIGS. 6A-6D show exemplary nano-patterns, in accordance with aspects of the present technology.
Figure 6B:
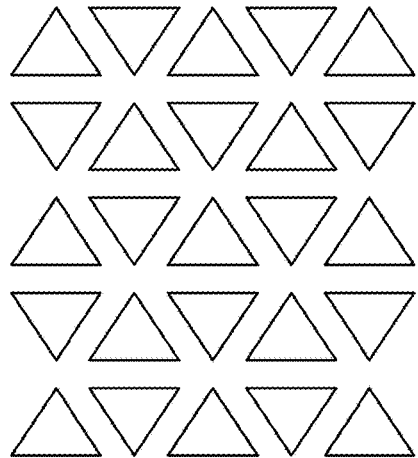
Figure 6C:
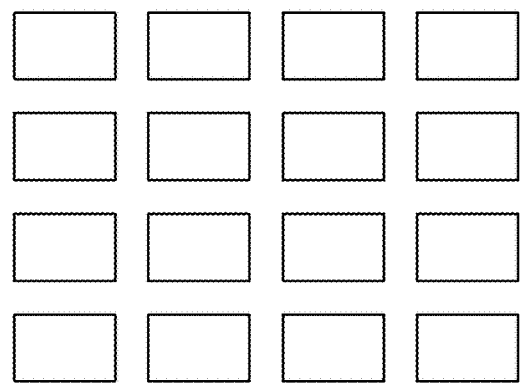
Figure 6D:
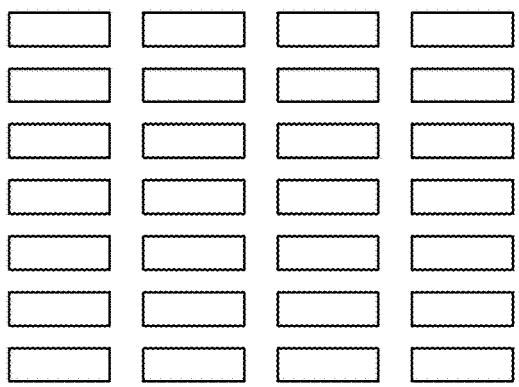

Referring now to FIG. 5, an exemplary nano-pattern, in accordance with aspects of the present technology, is shown. In the exemplary nano-pattern, a cluster of seven hexagonal openings/nanowires characterized by a predetermined spacing is illustrated. The clusters of openings/nanowires can be characterized by a cross-sectional width d (also referred to as lateral size) 510, separation a (also referred to as lattice constant) 520, and the reciprocal lattice vectors M 530 and K 540 both emanating from a center point Γ 560. The cross-sectional width d 510 and separation a 520 are not the same size. In one implementation, the cross-sectional width d 510 relative to the separation a 520 can be indicated by the relationship d=0.85a.

Referring again to FIG. 4, a lower portion of the nanowires 110 in the one or more clusters can be formed in the one or more clusters of opening in the nano-pattern layer, at 430. The lower portion of the nanowire can include a group III-V compound semiconductor with a first type of doping formed on the substrate through the ono or more cluster of openings in the nano-pattern layer. The cross-sectional width d 510 and separation a 520 are not the same size. In one implementation, the cross-sectional width d 510 relative to the separation a 520 can be indicated by the relationship d=0.85 a. In one implementation, the lower portion of the nanowire 110 can be formed by selective area epitaxy of GaN with Silicone (Si) doping (e.g., n-doping) on top of the substrate through the one or more cluster of openings in the nano-patterned layer using plasma assisted Molecular Beam Epitaxy (MBE) to form the lower portion of the nanowire 110 with a cross-sectional width (also referred to as lateral size) of approximately 200 nm and a height of approximately 380 to 460 nanometers (nm). The growth conditions for the Si-doped (GaN) can include a grow temperature of approximately 800 degrees Centigrade (° C.), with a nitrogen flow rate of approximately 0.6 standard cubic centimeter per minute (sccm), a forward plasma power of approximately 350 Watts (W), and a Ga Beam Equivalent Pressure (BEP) or approximately $3.5 \times 10^{-7}$ Torr. The one or more clusters of nanowires can be characterized by a cross-sectional width d (also referred to as lateral size) 510, separation a (also referred to as lattice constant) 520, and the reciprocal lattice vectors M 530 and K 540 both emanating from a center point Γ 560, as illustrated in FIG. 5.

The method of fabrication can include forming a core-shell quantum structure of the one or more clusters of nanowires 310. The core-shell quantum structure can include one or more core quantum structures and a shell quantum structure, as described above with reference to FIG. 1 in more detail. At 440, a first quantum active region 120 can be formed on each nanowire in the one or more clusters. In one implementation, Indium Gallium Nitride (InGaN) can be formed by selective area epitaxy on the Silicone doped GaN of the lower portions of the one or more clusters of nanowires to form the first quantum active region 120 with a height of approximately 5 nm. The InGaN can be deposited using plasma assisted MBE, wherein the growth conditions can include a substrate temperature of approximately 600° C., a Ga BEP of approximately $9 \times 10^{-9}$ Torr and In BEP of approximately $7.5 \times 10^{-8}$.

At 450, a first quantum barrier region 130 can be deposited. In one implementation, Aluminum Gallium Nitride (AlGaN) can be formed by selective area epitaxy on the InGaN for form the first quantum barrier region 130 with a height of approximately 5 nm. For example, the can be deposited using plasma assisted MBE, wherein the growth conditions can include a substrate temperature of approximately 600° C., a Ga BEP of approximately $9 \times 10^{-9}$ Torr, and Al BEP of approximately $4.5 \times 10^{-9}$. The incorporation of AlGaN in the quantum barrier region 130 leads to the formation of an AlGaN or Aluminum-rich GaN shell surrounding the one or more InGaN quantum active regions due to the smaller Al adatom migration length compared to Ga and In adatoms.

An AlGaN compound semiconductor can be used for the quantum barrier region 130 to achieve a nanowire having ultraviolet wavelengths of emission. In another implementation, the quantum barrier region 130 can include Indium Gallium Arsenide (InGaAs) to achieve a pumice having infrared wavelengths of emission. In yet another implementation, the quantum barrier region 130 can include Indium Arsenide (InAs) to achieve a nanowire having mid-infrared wavelengths of emission.

The processes at 440 and 450 can be performed one or more times to form the second portion of each nanowire in the one or more clusters. For example, the processes at 440 and 450 can be iteratively performed ten times to form a second portion of the nanowires including ten quantum core structures and a quantum shell structure disposed about the periphery of the ten quantum core structures.

At 460, an upper portion of the nanowires 150 including a group III-V compound semiconductor with a second type of doping can be formed. In one implementation, the group III-V compound semiconductor with the first type of doping can be p-dope Gallium Nitride (GaN). The group III-V compound semiconductor with the second type of doping can be deposited by selective area epitaxy. For example, the upper portions of the nanowires 150 in the one or more clusters can be formed by selective area epitaxy of GaN with Magnesium (Mg) doping (e.g., p-doping) on top of a quantum barrier region and surrounding quantum shell structure 140 using plasma assisted. Molecular Beam Epitaxy (MBE) to form the upper portion of the nanowire 150 with height of approximately 30 to 80 nm. The growth conditions for the Mg-doped GaN can include a Ga BEP of approximately $3.5 \times 10^{-7}$ Torr, a Mg BEP of approximately $2 \times 10^{-9}$ and a substrate temperature of approximately 750° C.

The incorporation of AlGaN in the one or more quantum barrier regions 130 of the core-shell quantum structure 120-140, instead of GaN barriers as used in the conventional art, advantageously leads to the formation of the AlGaN quantum shell structure 140 surrounding the quantum core structure 120, 130. This particular core-shell quantum structure 120-140 formation process is due to the smaller Al adatom migration length compared to Ga and In adatoms. The resulting core-shell quantum structure 120-140 can advantageously suppress non-radiative suffice recombination resulting an enhanced luminescence intensity and luminescence efficiency of the nanowires 310.

At 470, an optional optically transmissive insulator layer 345 can be deposited on the substrate about the one or more clusters of nanowires. In one implementation, the insulator layer can be an optically transmissive polyimide layer conformally deposited on the substrate, and about and on top of the one or more cluster of nanowires. The insulative layer can be planarized, wherein tops of the one or more clusters of nanowires are exposed and the optically transmissive insulative layer is disposed between the one or more clusters of nanowires.

At 480, an optional first set of one or more layers of a first contact 330-340 can be deposited on the planarized surface of the optically transmissive insulator layer 345 and the exposed tops of the one or more clusters of nanowires 310. The first set of one or more layers of the first contact can be electrically coupled to the one or more clusters of nanowires. In one implementation, a first layer of Nickle, Gold and/or alloys thereof can be deposited on the optically transmissive insulator layer and the exposed tops of the one or more clusters of nanowires. The first layer of Nickle (Ni), Gold (Au) and/or NiAu alloys thereof can be deposited as a very thin film that is configured to be substantially optically transmissive. Alternatively, a masking and selective etching process, can be used to form one or more windows through the first layer of Nickle, Gold and/or alloys thereof. An Indium Tin Oxide (ITO) layer can be deposited on the first layer of Nickle (Ni), Gold (Au) and/or NiAu alloys thereof. The ITO layer can be configured to be optically transmissive. A second layer can be deposited on the ITO layer. A masking and selective etching process can be used to form one or more windows through the second layer of Nickle (Ni), Gold (Au) and/or NiAu alloys thereof.

At 490, an optional second contact 350 can be deposited on the substrate 320 opposite the one or more clusters of nanowires 310, the optically transmissive insulator layer 345 and first contact 330-340. In one implementation, a layer of Titanium (Ti), Gold (Au) and/or TiAu alloys thereof can be deposited on the substrate to form the second contact.

Referring now to FIGS. 6A-6D, exemplary nano-patterns, in accordance with aspects of the present technology, as shown. The nano-pattern can represent the opening of a corresponding nano-pattern layer or the cross-section shape of nanowires formed therein. The nano-pattern can include one or more clusters of hexagonal, square, rectangular, rhombic, polygonal, circular, elliptical or similar cross-sectional shaped openings/nanowires or combinations thereof, characterized by a predetermined spacing 610. These shapes are only a few examples of the many possible shapes that could be used in aspects of the present technology.

Figure 7:
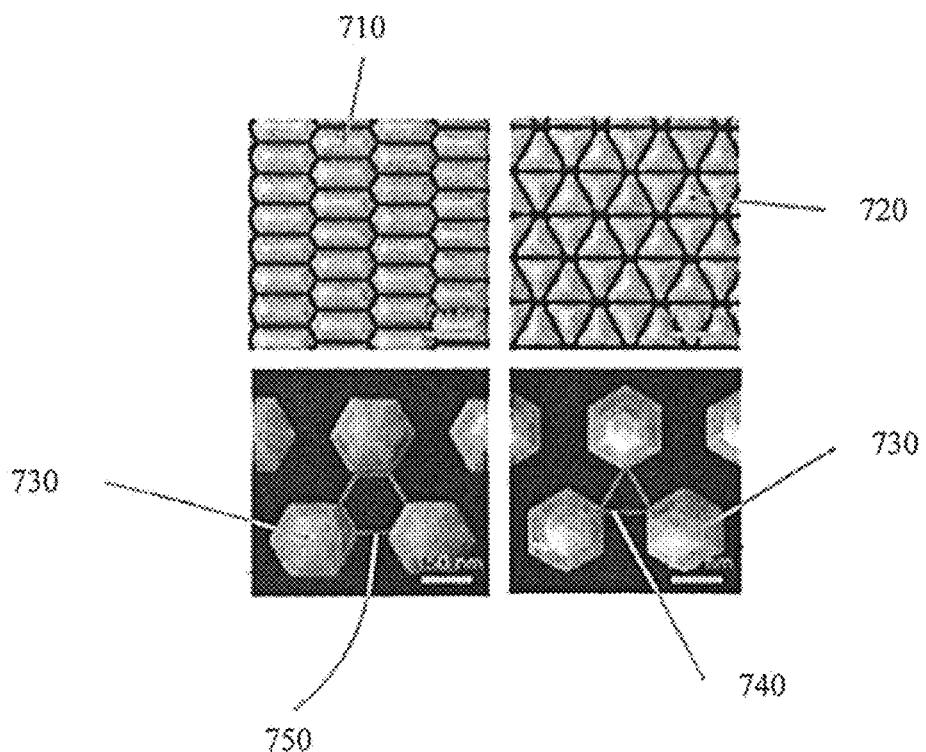
FIG. 7 shows and exemplary Scanning Electron Microscope (SEM) images of hexagonal nanowire structures, in accordance with aspects of the present technology.
Figure 8:
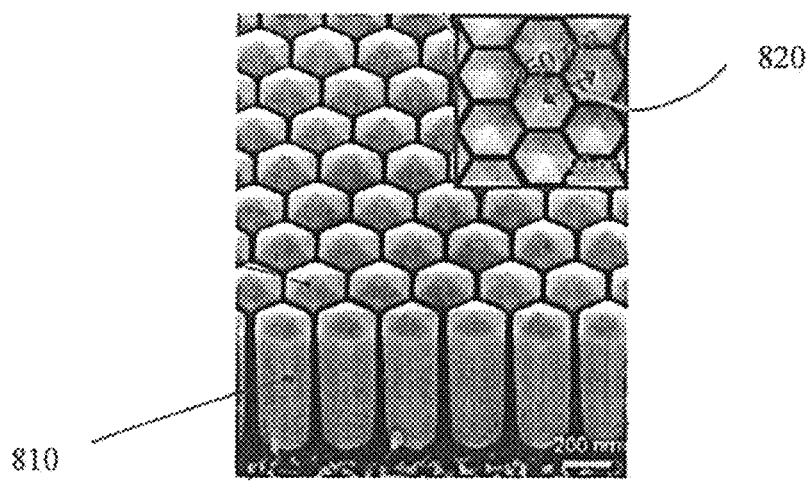
FIG. 8 shows and exemplary SEM images of hexagonal nanowire structures, in accordance with aspects of the present technology.
Figure 9:
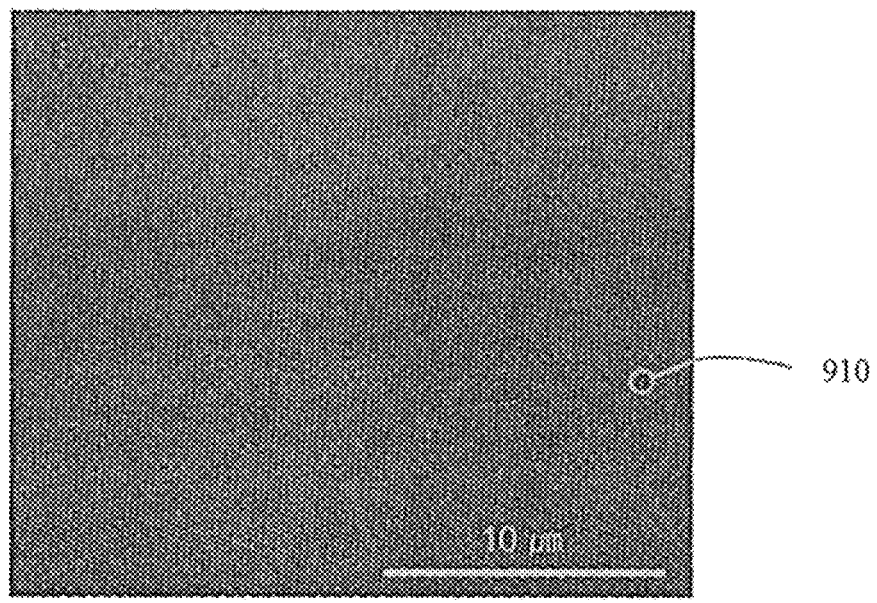
FIG. 9 shows and exemplary SEM images of hexagonal nanowire structures, in accordance with aspects of the present technology.

Referring now to FIGS. 7, 8 and 9, exemplary Scanning Electron Microscope (SEM) images of InGaN/AlGaN hexagonal nanowire structures which include dot-in nanowire, dot-in-nano-triangle, and dot-in-nano-rectangle arrays, are shown. The nanowire structures exhibit straight sidewalls and uniform size distribution. The photonic molecules can be arranged in various lattice structures, including rhombic 710, triangular 720 or hexagonal 730 lattices, with different orientations. The relative positioning of the nanowire structures with various shapes can form geometric shapes that can be for example of triangular shape 740 or hexagonal shape 750 as depicted in FIG. 7.

Take the nanowire array structure depicted in FIG. 8, as an example. In this example, the nanowire structures 810 are hexagonal shaped and are arranged in a triangular lattice with a lattice constant 820 of 250 nm shown in the inset of the image. The nanowire structures have lateral sizes of 215 nm and length, also referred to as height, of 560 nm. The air gap between neighboring nanowires is 35 nm. These nanowire structures 810 as depicted in FIG. 8 can form a large array of nanowire structures which could have a uniformity over a large area.

The uniformity of numerous InGaN nanowire structures across a large area is depicted in the Scanning Electron Microscope (SEM) image of FIG. 9. In the image of FIG. 9 individual nanowire structures 910 are visible in the form of tiny dots that form an array over the relatively large area of 25 μm×25 μm. The size of this area could be much larger though, but visible in the image is only a portion that is 25 μm×25 μm in size.

Figure 10:
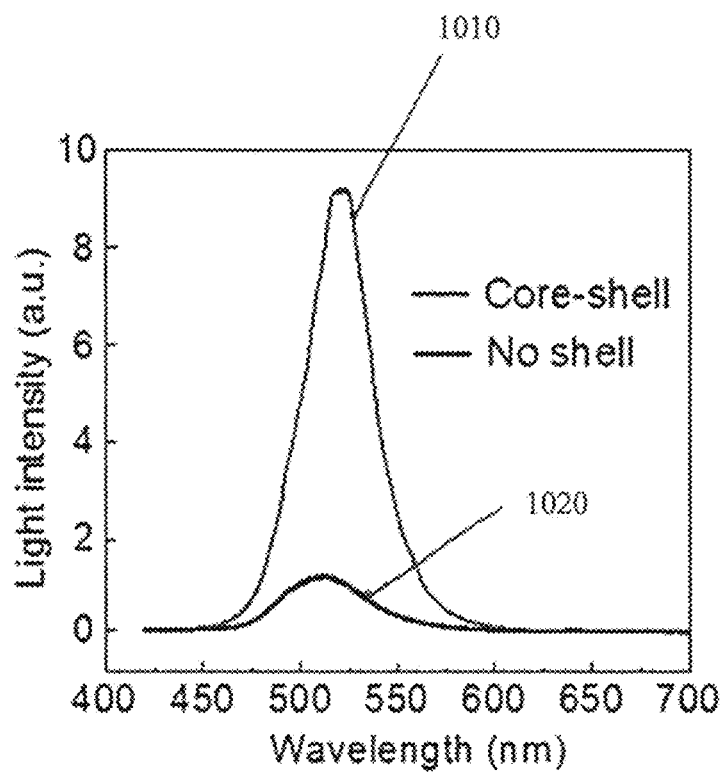
FIG. 10 shows a plot of an exemplary photoluminescence emission spectrum, in accordance with aspects of the present technology.

Referring now to FIG. 10, a plot of an exemplary photoluminescence omission spectrum of InGaN/AlGaN quantum nanowire structures measured at room temperature as compared to a photoluminescence emission spectrum of a conventional InGaN/AlGaN nanowire structures without controlled spacing, is shown. A plot of the photoluminescence emission spectrum of InGaN/AlGaN quantum nanowire structures 1010 and a plot of the photoluminescence emission spectrum of a conventional InGaN/AlGaN nanowire structures without controlled spacing 1020 is illustrated. Strong photoluminescence emission was observed at 505 nm wavelength with a relatively narrow spectral linewidth of approximately 12 nm for the photonic crystals illustrated in FIG. 8. The photoluminescence emission is highly uniform across a large nanowire array structures. For comparison, conventional InGaN nanowire array structures or epilayers exhibit 1020 broad spectral linewidths of approximately 35-50 nm, at 507 nm wavelength, which is limited by the large inhomogeneous broadening associated with Indium compositional variation and the presence of defects and strain field.

As illustrated in FIG. 10, the photoluminescence intensity of the InGaN/AlGaN quantum nanowire structures 1010 is enhanced by nearly a factor of eight compared to InGaN/GaN nanostructures without the formation of an AlGaN shell 1020. Photoluminescence and cathodoluminescence material characterization techniques were used to assess the material quality of the fabricated nanowire array structures. In these experiments a 405 nm wavelength laser was used as the excitation source for the photoluminescence measurement of the InGaN/AlGaN nanowire heterostructures. A visible neutral density filter was used to adjust the laser excitation powers in range of 29 W/cm² to 17.5 kW/cm². The emitted light was spectrally resolved by a high-resolution spectrometer, and was detected by a high sensitivity and low noise liquid nitrogen cooled Charge Coupled Device (CCD) in the visible range. Temperature dependent photoluminescence measurements were carried out using a helium closed-loop cryostat. cathodoluminescence measurement was performed using a Zeiss Supra 55 VP field emission gun Scanning Electron Microscope (SEM) equipped with a cryogenic stage coupled to a Gatan MonoCL 2 setup. A gold thin film layer was deposited on the substrate in order to suppress charging effect induced by the electron beam. The accelerating voltage used in the cathodoluminescence characterization was 1.0 KeV. The emission was collected by a parabolic mirror and detected using a dry-ice cooled photomultiplier tube.

Figure 11:
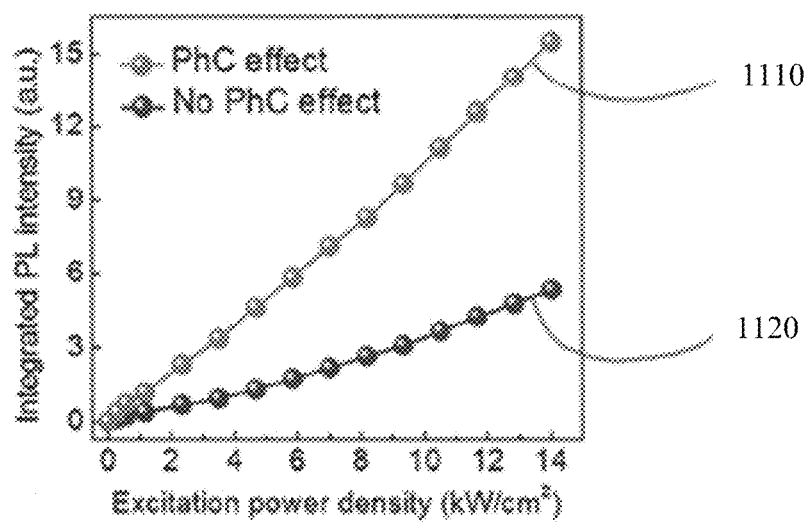
FIG. 11 shows an exemplary plot of light intensity versus excitation power, in accordance with aspects of the present technology.

Referring now to FIG. 11, an exemplary plot of light intensity versus excitation power of InGaN/AlGaN quantum nanowire structures as compared to a conventional InGaN/AlGaN nanowire structures without controlled spacing, is shown. The integrated luminescence intensity (area under the plot) is nearly three times higher in the InGaN/AlGaN quantum nanowire structures 1110 as compared to InGaN/AlGaN nanowire structures without controlled spacing grown under similar conditions 11120. The unique dependence of the luminescence emission on the nanowire spacing and height, as well as the impact of optical confinement of photonic crystals on the temperature and power-dependent emission characteristics of InGaN is described bother below.

Figure 12:
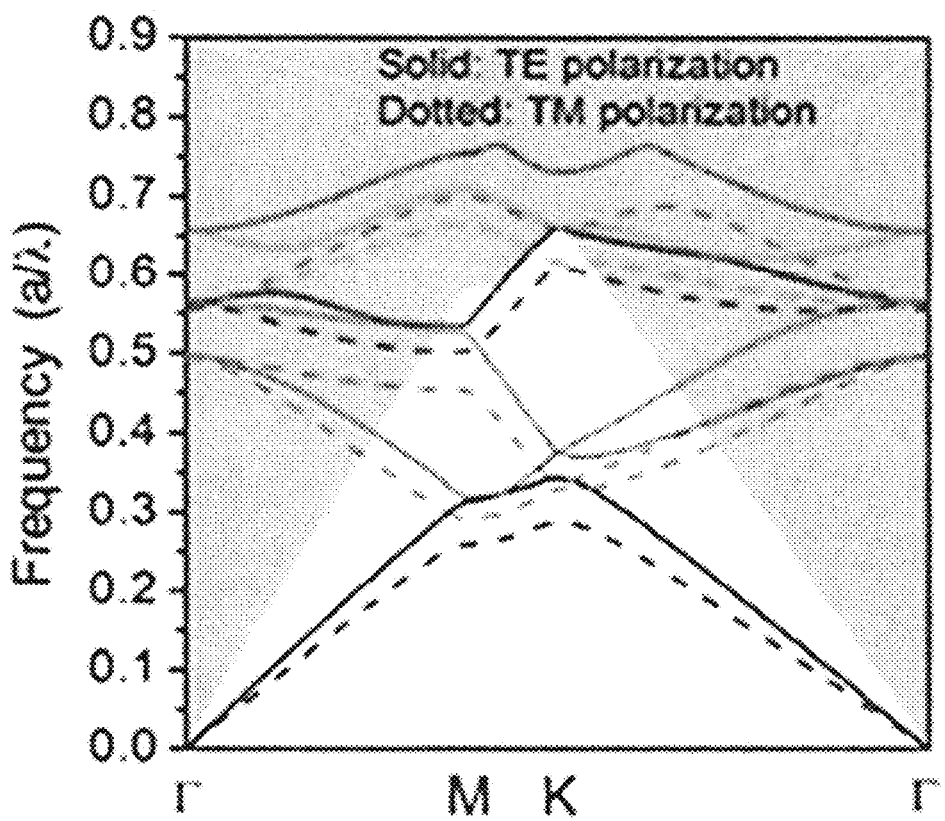
FIG. 12 shows a diagram of simulated photonic crystals, in accordance with aspects of the present technology.

Referring now to FIG. 12, a diagram of simulated photonic crystals, in accordance with aspects of the present technology, is shown. The photonic crystals can be characterized by the parameters "M", "K", and "Γ" that were discussed earlier and are depicted in FIG. 5 with the numerical indicators 530, 540 and 550 respectively are depicted here in FIG. 12 on the horizontal axis of the diagram.

The refractive index of InGaN nanowires is 2.37. The normalized frequency of the band-edge mode is approximately 0.49, which corresponds to a wavelength l=505 nm for a lattice constant a=250 nm. By adjusting the flat bands of leaky modes, (e.g., frequencies around 0.49) to match the emission wavelengths of the active region, the luminescence efficiency can be significantly enhanced, due to the Purcell effect. The group velocity can be determined by the slope of the dispersion curve in the photonic band structure. At the band edge, a low group velocity can be achieved, (i.e. dw/dk approaching 0) for frequencies around 0.49 near the Γ point, thereby leading to the formation of a stable and large cavity mode. The low group velocity and the resulting long interaction time between radiation field and active material can lead to a considerably enhanced spontaneous emission rate. Moreover, due to Bragg scattering, the light extraction efficiency can also be enhanced.

Figure 13:
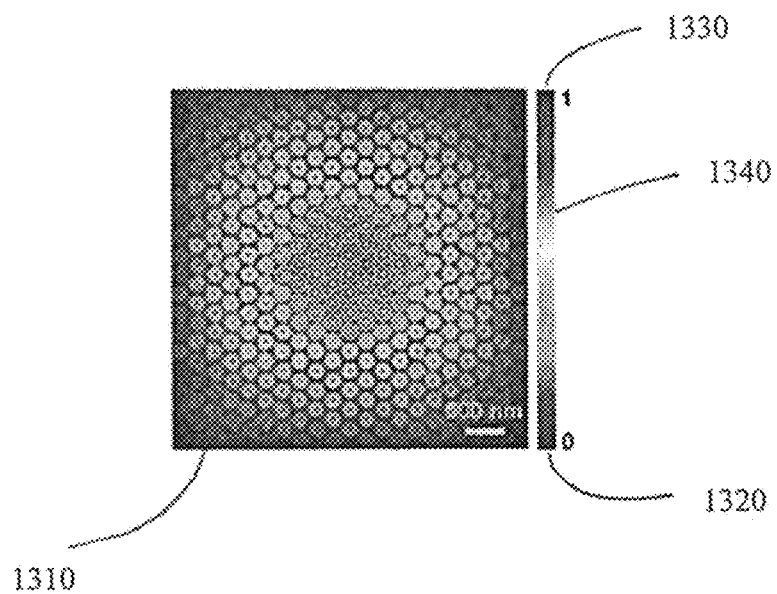
FIG. 13 shows an exemplary electric field profile, in accordance with aspects of the present technology.

Referring now to FIG. 13, an exemplary electric field profile, in accordance with aspects of the present technology, is shown. The electric field profile 1310 of the band edge mode calculated by a three-dimensional finite-difference time-domain method for a band edge mode (λ=505 nm) for an areal size of 5 µm×5 µm over a range extending from 1320 to 1330 as depicted by the color code bard 1340, is illustrated.

Figure 14A:
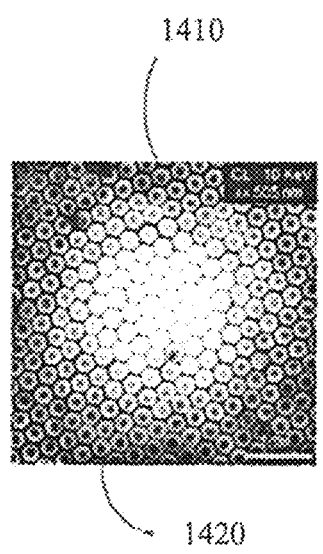
FIGS. 14A-14C show exemplary cathodoluminescences for crystals of different areal sizes, in accordance with aspects of the present technology.
Figure 14B:
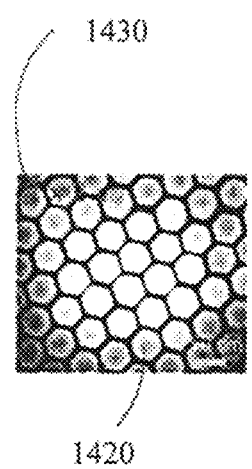
Figure 14C:
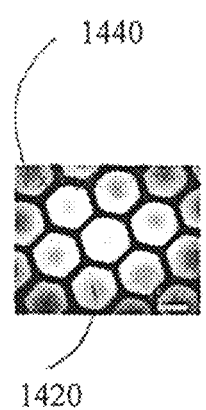

Referring now to FIGS. 14A-14C, exemplary cathodoluminescences for crystals of different areal sizes, in accordance with aspects of the present technology, are shown. The formation of stable and scalable optical modes in the bottom-up photonic crystals in accordance with aspects of the present technology is revealed by the cathodoluminescence studies. In FIG. 14A, the cathodoluminescence 1410 was taken at a wavelength of approximate 505 nm at room temperature. The areal size being excited by the e-beam was 5 µm×5 µm. As illustrated, the band edge mode spreads across the entire crystal structure of hexagonally shaped nanowire structures 1420. This is in agreement with the calculation shown in FIG. 13. Strong light confinement occurs near the center region of nanowire arrays by the scattering of the band edge mode. Moreover, it is interesting to observe that strong photon confinement can also be achieved for crystals with areal size as small as 2 µm×2 µm as depicted 1430 in FIG. 14B, and even as small as 1 µm×1 µm as depicted 1440 in FIG. 14C. The results depicted in FIGS. 14A-14C confirm the scalability of the band edge modes.

Figure 15:
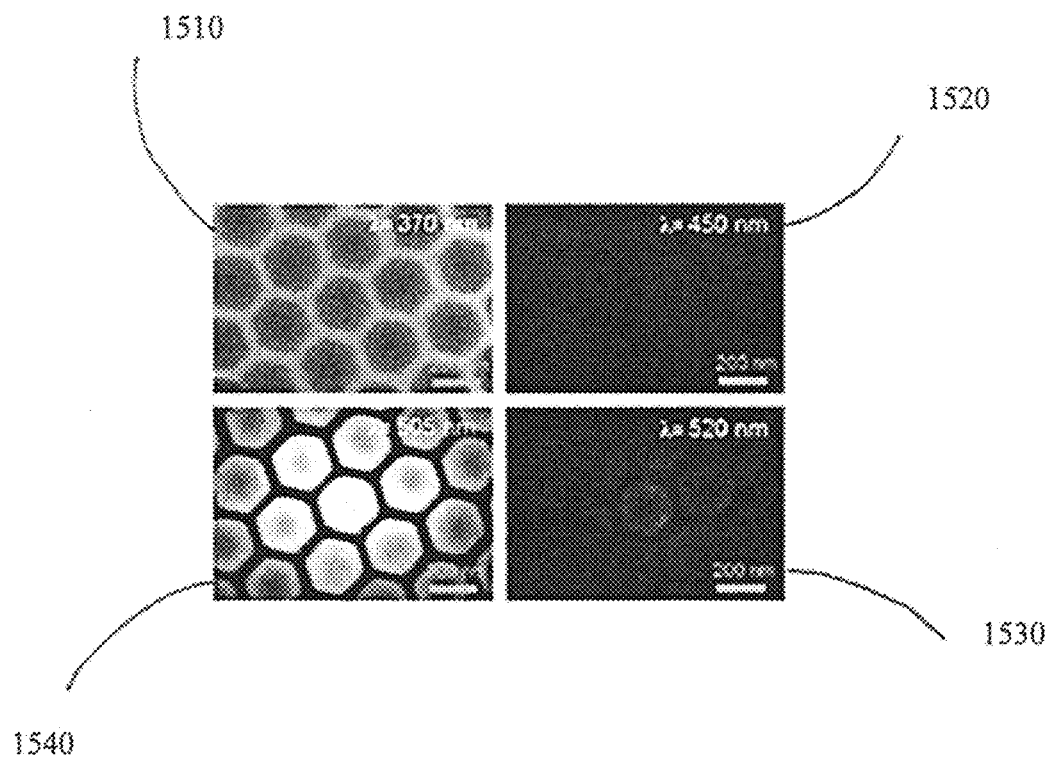
FIG. 15 the spectrally resolved cathodoluminescence mapping images collected at various wavelengths.
Figure 16:
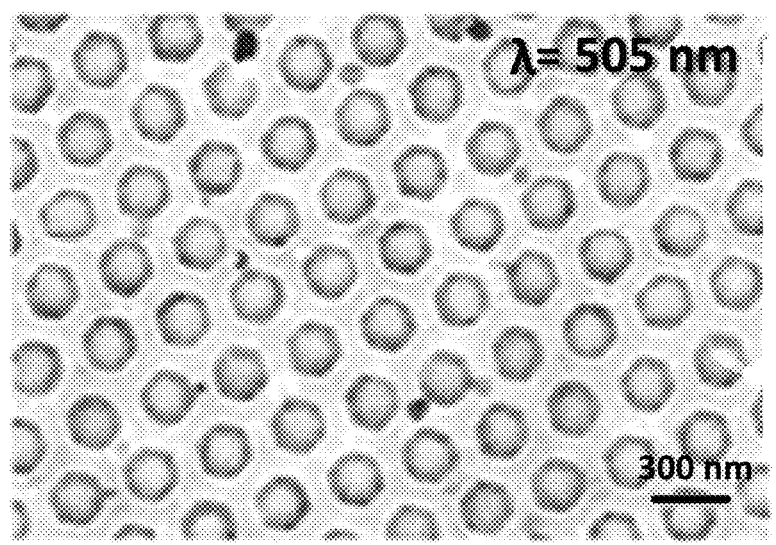
FIG. 16 shows a cathodoluminescence mapping image, in accordance with aspects of the present technology.

Detailed cathodoluminescence measurements were also performed for InGaN photonic crystals with different design parameters and at different emission wavelengths. These results are depicted in FIGS. 15 and 16 further below. These studies provided unambiguous evidence for the formation of strongly confined, highly uniform, and scalable band edge modes of InGaN photonic crystals, thereby offering a viable approach for realizing both small and large scale efficient light emitters.

FIG. 15 depicts the spectrally resolved cathodoluminescence mapping images collected at various wavelengths of 370 nm, 450 nm, 505 nm and 520 nm, respectively. These results are evidence of the presence of band edge mode and strong optical confinement effect only at an emission wavelength of 505 nm.

FIG. 16 depicts a cathodoluminescence mapping image at the wavelength of 505 nm for InGaN nanowire arrays with a relatively large spacing compared to the optimum design depicted in FIG. 15, showing the absence of the hand edge mode. Due to the weaker emission for the image shown in FIG. 16, the measurement was performed with a relatively long integration time to clearly show the light distribution.

Figure 17:
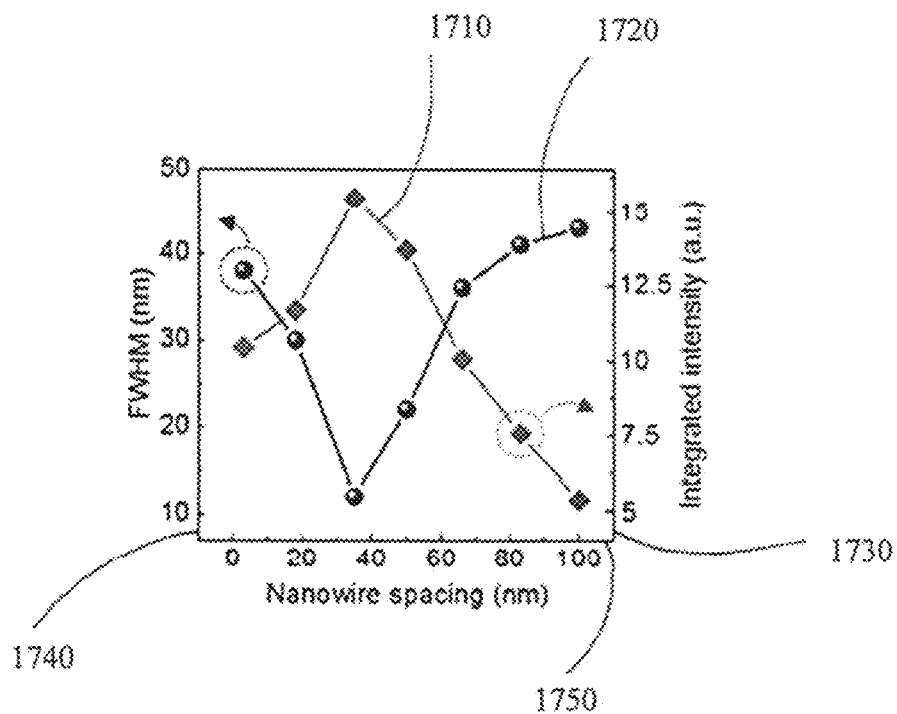
FIG. 17 shows exemplary plots associate with the variations of the luminescence intensity and spectral linewidth, in accordance with aspects of the present technology.

Further extensive studies were performed on InGaN nanowire structures with different design parameters. Referring now to FIG. 17, exemplary plots associate with the variations of the luminescence intensity and spectral linewidth, in accordance with aspects of the present technology, is shown. The variations of the luminescence intensity and spectral linewidth with varying nanowire spacing while keeping the lattice constant parameter a constant are illustrated. The plots 1710 and 1720 depict the variations of the integrated luminescence intensity 1730 and Full Width Half Maximum (FWHM) 1740 of InGaN nanowire structures versus nanowire spacing 1750.

Figure 18:
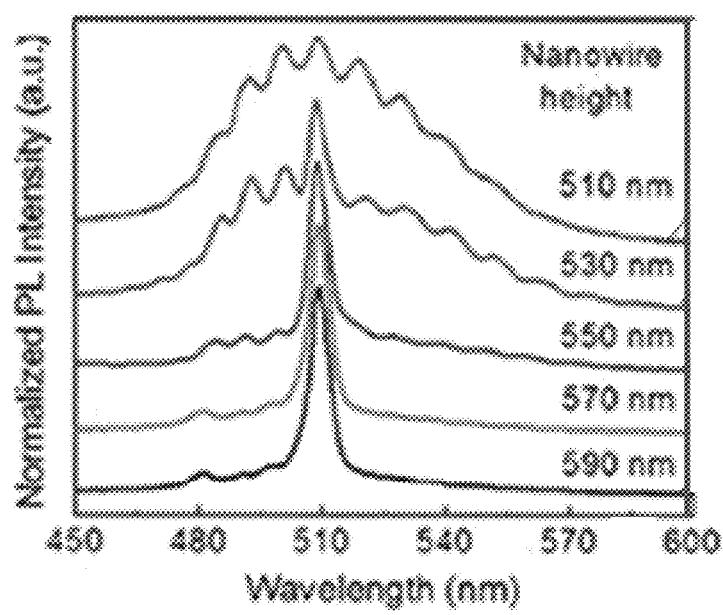
FIG. 18 shows plots of photoluminescence emission spectra for various nanowire structure heights, in accordance with aspects of the present technology.

Crystal growth epitaxy conditions were optimized to have similar spontaneous emission from the quantum dot active regions when the nanowire spacing is varied. In FIG. 18, it is seen that the emission characteristics, in terms of both the spectral linewidth and integrated intensity, depend critically on the nanowire spacing. The highest luminescence intensity and narrowest spectral linewidth occurs for a nanowire spacing of 35 nm. A decrease, or increase nanowire spacing lead to a reduction in the luminescence intensity accompanied by a significant increase in the spectral linewidth, which suggests a reduced, or minimal level of coupling between the quantum dot spontaneous emission and the band edge mode. Since the light extraction efficiency of leaky modes does not change significantly for such small variations of nanowire spacing, the measured variations of luminescence emission may be primarily attributed to the change of the Purcell effect. Based on the measured internal quantum efficiency of approximately 2 to 30% at room-temperature for the InGaN photonic crystals, and assuming a constant light extraction efficiency, the magnitude of Purcell enhancement factor (Fp) is estimated to be in the range of 3 for the spatially extended band edge mode, which is comparable to that for the very small mode in a nanocavity. The relatively large Purcell factor is partly related to the large mode degeneracy factor g depicted in Equation 2 associated with the large modal volume. The extreme sensitivity of the Purcell effect on the nanowire spacing (radius) was not seen in conventional slab photonic crystals, which is partly related to the quasi three-dimensional nature of InGaN nanowire photonic crystals, due to the presence of planar GaN substrate as well as the finite length of InGaN nanowires. This observation is further supported by the critical dependence of the emission characteristics of InGaN nanowire photonic crystals on the height of nanowires as illustrated in FIGS. 1 and 18.

Figure 19:
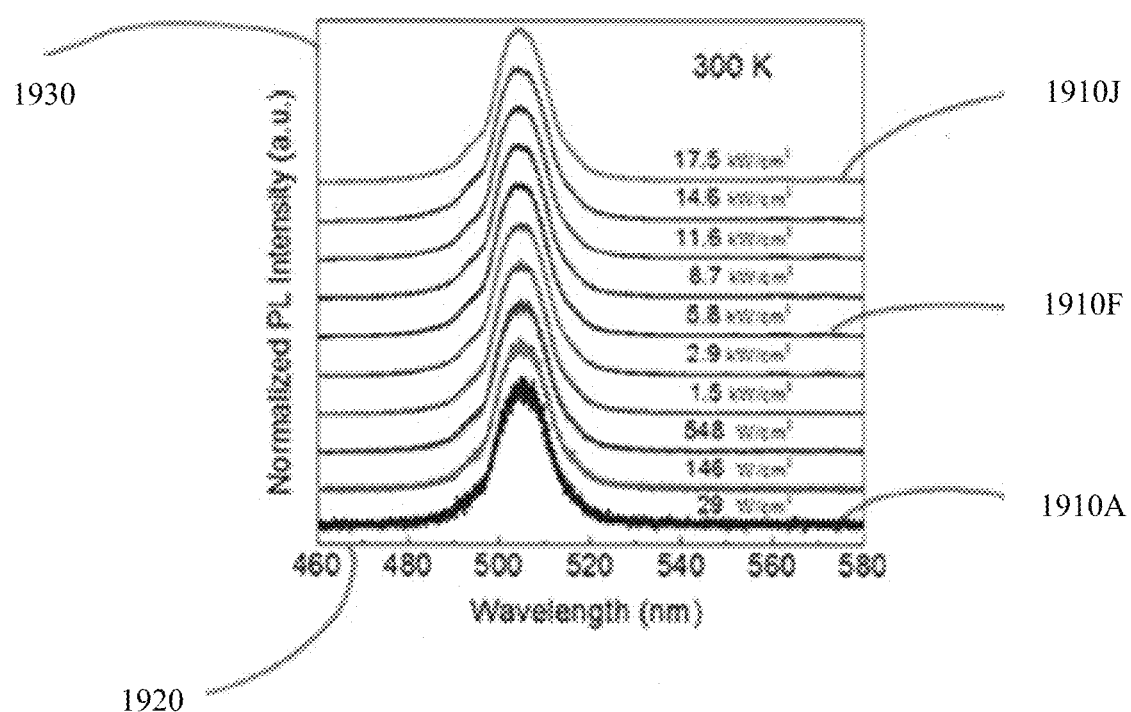
FIG. 19 shows normalized photoluminescence emission spectra, in accordance with aspects of the present technology.

Due to the presence of quantum-confined Stark effect, conventional InGaN light emitters generally exhibit significant blueshift with increasing pumping power. Moreover, the emission characteristics also vary considerably with temperature, due to the Varshni's effect. In contrast, we have measured remarkably stable emission characteristics for InGaN nanowire photonic crystals. Depicted in FIG. 19 are the normalized photoluminescence emission spectra of InGaN photonic crystals measured at excitation power from 29 W/cm$^2$ to 17.5 KW/cm$^2$ at room-temperature. From the ten plots 1910A to 1910J, it is seen that the emission spectra remains nearly identical. In the diagram the horizontal axis 1920 indicates the wavelength in units of nm and the vertical axis 1930 indicates the normalized photoluminescence intensity in arbitrary units (a.u.).

Figure 20:
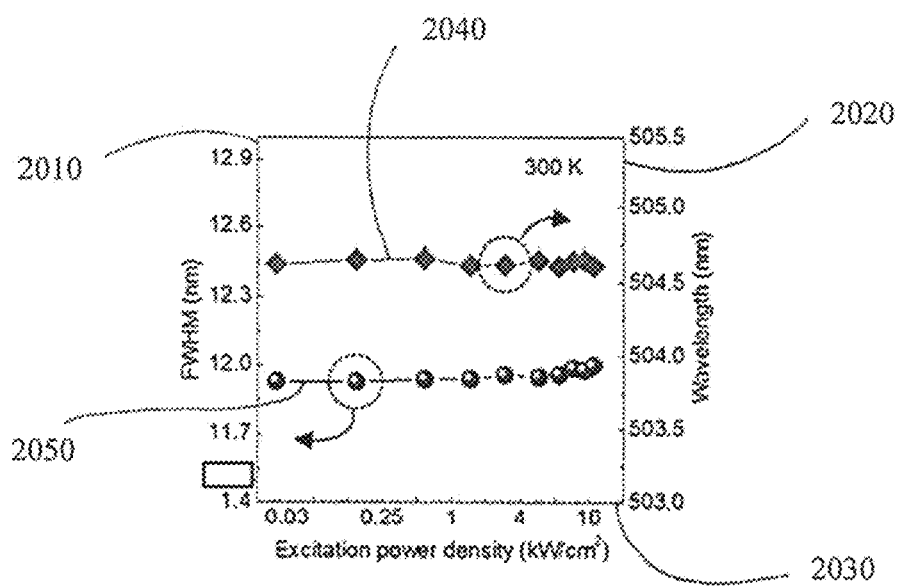
FIG. 20 shows exemplary plots of the peak emission wavelength and spectral linewidth versus pumping power, in accordance with aspects of the present technology.

Referring now to FIG. 20, exemplary plots of the peak emission wavelength and spectral linewidth versus pumping power, in accordance with aspects of the present technology, are shown. In the diagram, the vertical axis 2010 indicates FWHM in units of nm, the other vertical axis 2020 indicates the wavelength of emission in units of nm, and the horizontal axis 2030 indicates the excitation power density in units of KW/cm$^2$. As illustrated, the peak emission wavelengths 2040, at approximately 505 nm, and the spectral linewidths 2050, FWHM at approximately 12 nm, are virtually invariant as a function of pumping power.

Figure 21:
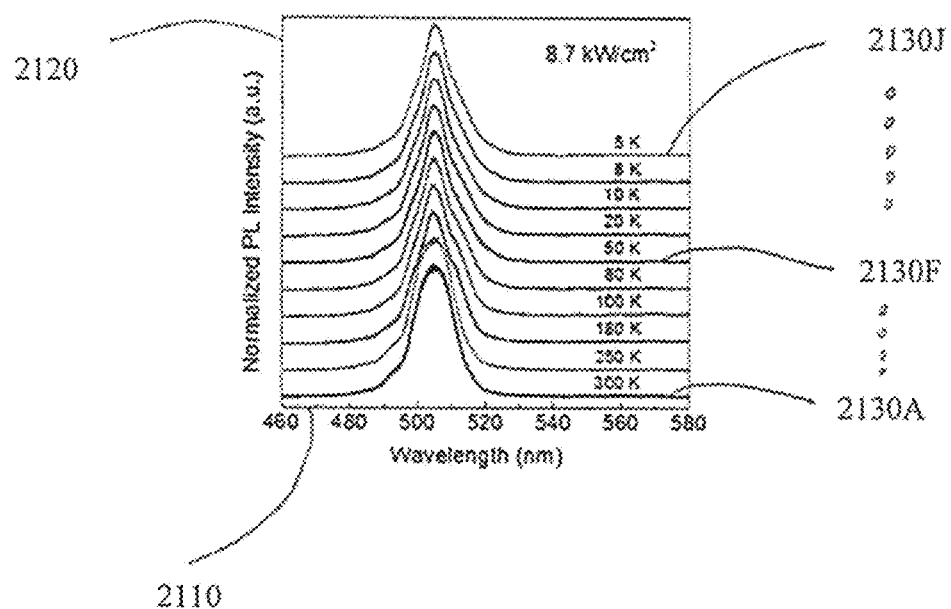
FIG. 21 shows exemplary plots of luminescence emission spectra of InGaN nanowire structures, in accordance with aspects of the present technology.

Referring now to FIG. 21, exemplary plots of luminesce emission spectra of InGaN nanowire structures, in accordance with aspects of the present technology, are shown. In the diagram, the horizontal axis 2110 indicated the wavelength of emission in units of nm and the vertical axis 2120 indicates the normalized photoluminescence intensity in arbitrary units (a.u.). As depicted, luminescence emission spectra were measured in the temperature range of 5 to 300 Kelvin (° K) in the ten plots 2130A-2130J. The results were measured under 8.7 KW/cm$^2$ continuous wave pumping condition.

Figure 22:
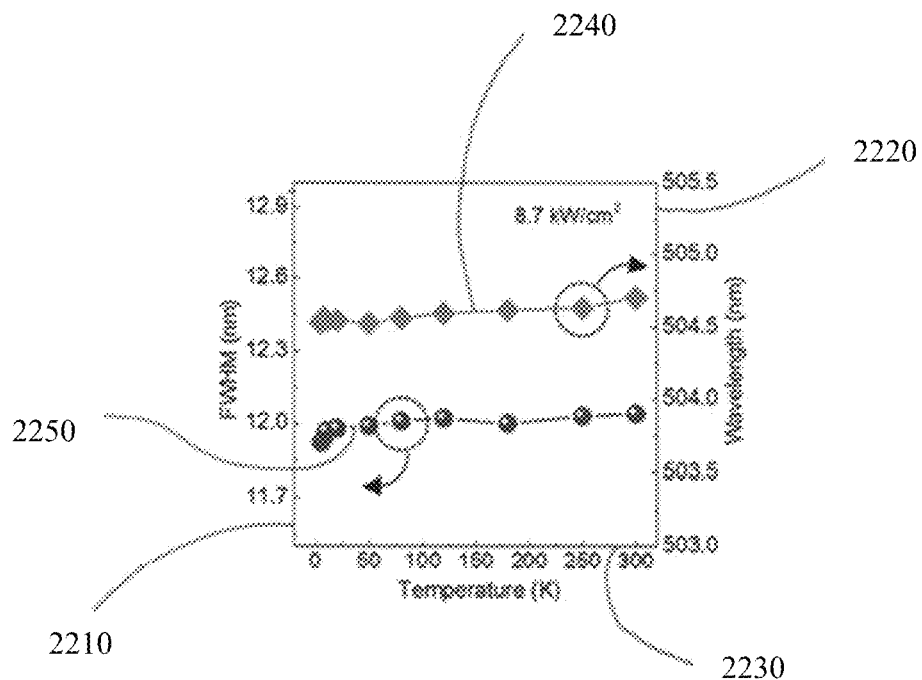
FIG. 22 shows exemplary plots associated with the variations of the emission wavelength peak with temperature and the variations of spectral linewidth with temperature, in accordance with aspects of the present technology.

Referring now to FIG. 22, exemplary plots associated with the variations of the emission wavelength peak with temperature and the variations of spectral linewidth with temperature, in accordance with aspects of the present technology, are shown. In the diagram, the vertical axis 2210 indicates the wavelength of emission in units of nm, the other vertical axis 2220 indicated the FWHM parameter in units of nm, and the horizontal axis 2230 indicates the temperature in units of ° K. As illustrate, both the emission wavelengths 2240, at approximately 505 nm, and spectral linewidths 2250, at approximately 12 nm, remained nearly constant in the temperature range of 5 to 300 K. The remarkably stable emission characteristics of InGaN nanowire structures are drastically different from the commonly measured S-shape dependence on temperature for conventional InGaN quantum wells, induced by charge carrier redistribution in the localized states and bandgap reduction with increasing temperature. Such extraordinary emission stability stems directly from the efficient coupling of InGaN quantum dot emission to the robust band edge modes of InGaN photonic crystals, which is virtually independent of device operating conditions and largely determines the emission characteristics.

Figure 23:
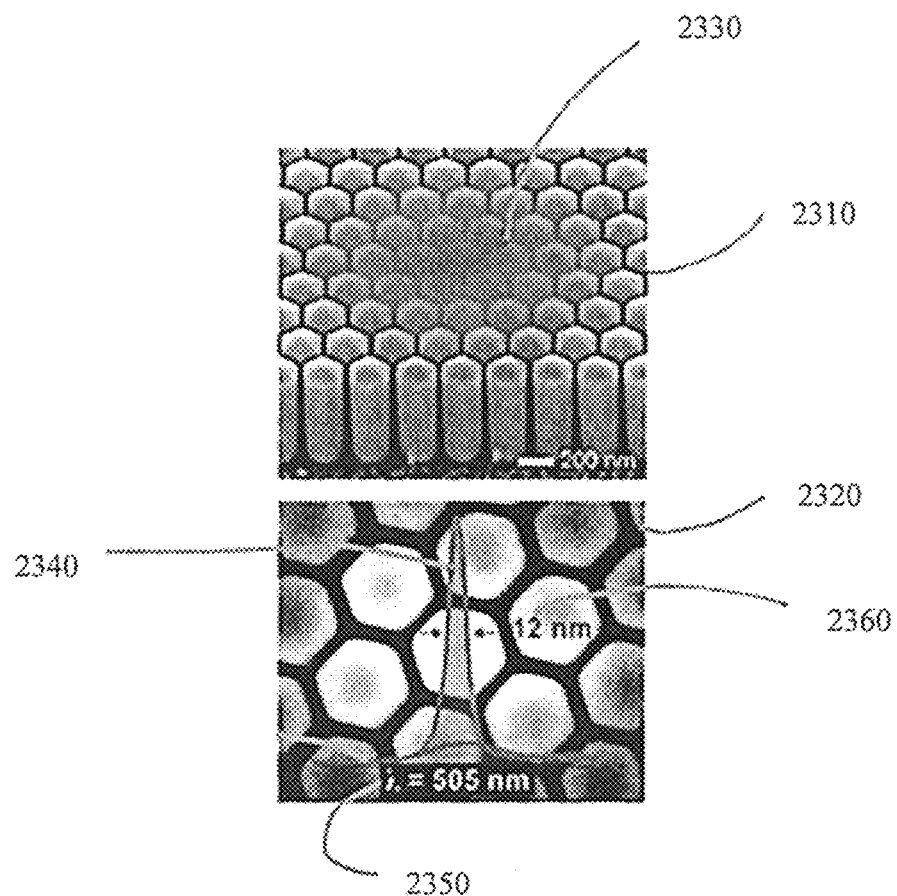
FIG. 23 shows an array of nanowire structures and an associated photoluminescence emission pattern, in accordance with aspects of the present technology.

Referring now to FIG. 23, an array of nanowire structures and an associated photoluminescence emission pattern, in accordance with aspects of the present technology, is shown. For the array of nanowire structures 2310, 2320, the photoluminescence emission pattern 2330 and the spectral curve 2340 of the photoluminescence emission, at a wavelength of approximately 505 nm 2350 as indicated by the FWHM value of approximately 12 nm 2360 are depicted.

Referring again to FIG. 9, the image of a 45° tilted-view SEM image of the InGaN nanowire structure, in accordance with aspects of the present invention, is shown. As depicted, individual nanowire structures 910 are visible in the form of tiny dots that from an array over a relatively large area. The size of the area covered by the nanowire array could be much larger than the 25 µm×25 µm that is visible in the image of the sample. The image is evidence of extremely high uniformity across a large area.

Figure 24:
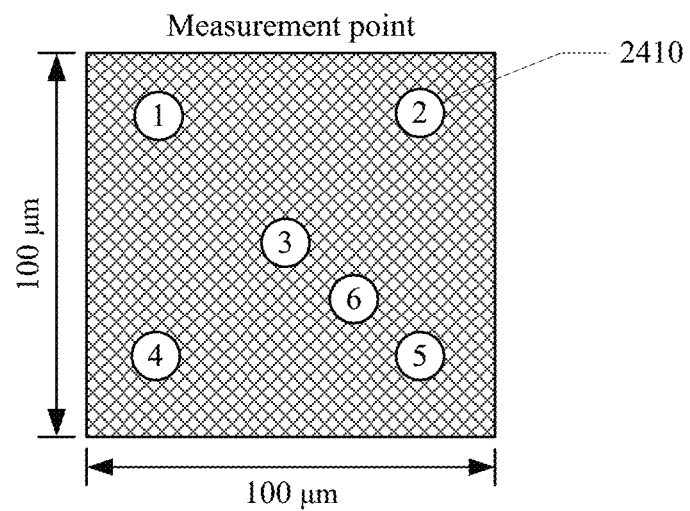
FIG. 24 shows the emission stability of InGaN nanowire structures across a large area, accordance with aspects of the present technology.
Figure 25:
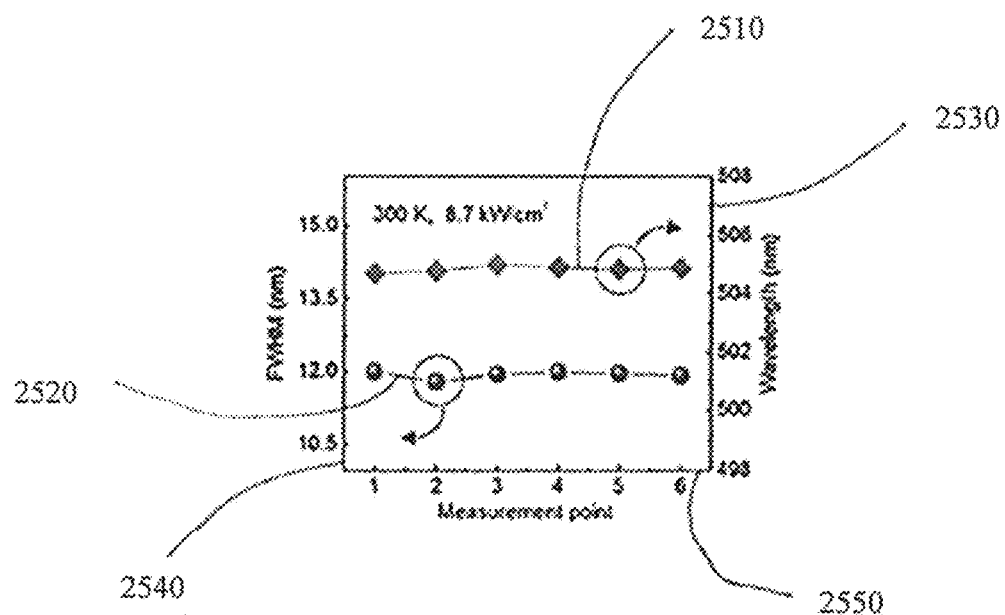
FIG. 25 shows the emission stability of InGaN nanowire structures across a large area, accordance with aspects of the present technology.

FIGS. 24 and 25 illustrate the measurement results associated with the emission stability of InGaN nanowire structures across a large area. The image in FIG. 24 is part of an experiment that was conducted in order to investigate the emission characteristics, including the uniformity and yield of InGaN nanowire structures fabricated in a large area. As illustrated in FIG. 24, six different points 2410 were measured in an area the size of 100 µm×100 µm. In this photoluminescence characterization experiment a 405 nm wavelength laser was used as the excitation source at room temperature. As illustrated in FIG. 25, the emission wavelengths, which are depicted by plot 2510, remain nearly invariant, at approximately 505 nm for various regions 2410 that are depicted in FIG. 24 of the nanowire structure. Also illustrated in FIG. 25 is the plot 2520 of FWHM values, that depict a narrow spectral linewidth of approximately 12 nm, is also nearly invariant for the various measurement points. In the plots of FIG. 25, the vertical axis 2530 indicates the wavelength value in units of nm, the other vertical axis 2540 indicates the FWHM values, and the horizontal axis 2550 indicates the 6 various measurement points 2410 that are depicted in FIG. 24. The extremely high yield and uniformity is attributed to the well-controlled nanowire size and position of the unique selective area epitaxy.

Referring again to FIG. 15 and FIG. 16, the images associated with cathodoluminescence mapping measurement results spectrally resolved at different emission wavelengths and with different design parameters are illustrated. To further confirm the formation of stabile band edge modes in InGaN photonic crystals, more detailed spectrally resolved cathodoluminescence mapping measurements were performed at different wavelengths.

FIG. 15 depicts the spectrally resolved cathodoluminescence mapping images 1510, 1520, 1530 and 1540 collected at various wavelengths of 370 nm, 450 nm, 505 nm and 520 nm, respectively, demonstrating the presence of band edge mode and strong optical confinement effect only at an emission wavelength of 505 nm. The cathodoluminescence image 1510 at 370 nm exhibits highly uniform contrast in the entire region. It was also noticed the spacing between nanowires shows brighter emission, which is due to the light emission from the underlying GaN template.

FIG. 16 depicts a cathodoluminescence mapping image at the wavelength of 505 nm for InGaN nanowire arrays with a relatively large spacing compared to the optimum design depicted in FIG. 15, showing the absence of the band edge mode. Due to the weaker emission for the image shown in FIG. 15, the measurement was performed with a relatively long integration time to clearly show the light distribution. Depicted in image the of FIG. 15 are the hexagonal cross sections of the nanowire structures with a lattice constant parameter "a" which is 360 nm and the nanowire lateral lattice size "d", which is 215 nm.

No emission was observed at 450 nm wavelength since there is no light emission from the nanowires in this wavelength. At 505 nm, strong optical confinement effect at the center region of nanowire arrays was clearly observed. Significantly weaker emission was also measured at 520 nm. These studies provide unambiguous evidence for the direct measurement of the band edge mode in defect-free nanowire structures. Also performed were cathodoluminescence wavelength mapping measurements of InGaN nanowire arrays with a relatively larger spacing compared to the optimum design. The image taken at a wavelength of 505 nm is depicted in FIG. 14A, and no optical confinement effect was observed.

Figure 26:
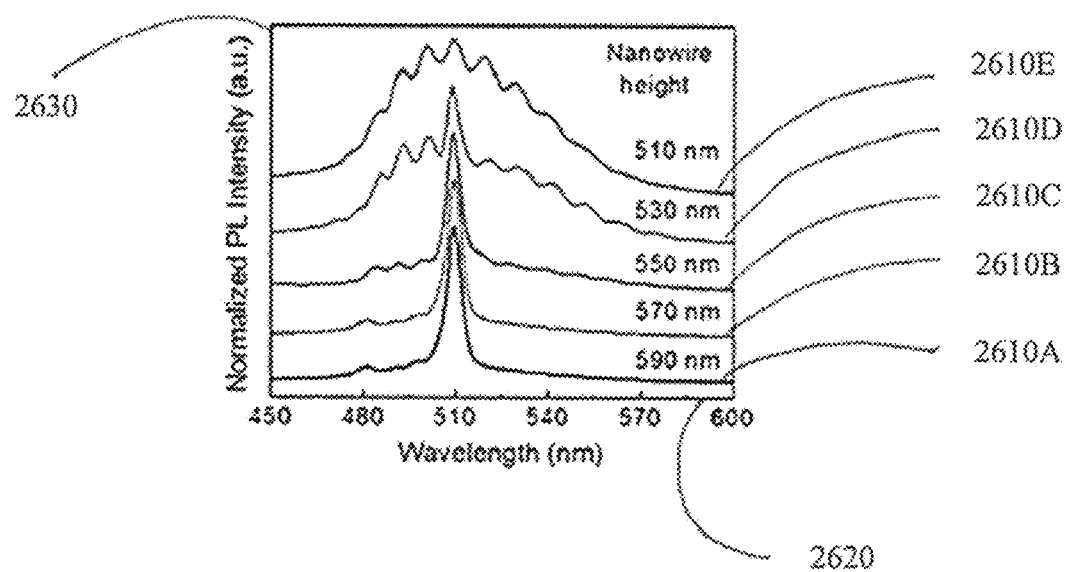
FIG. 26 shows the photoluminescence emission spectra of the InGaN nanowires, accordance with aspects of the present technology.

Referring now to FIG. 26, plots of the photoluminescence emission spectra or exemplary nanowire devices, in accordance with aspects of the present technology, is shown. Five InGaN/AlGaN nanowire structures were investigated, which had substantially identical designs except for the height of the n-GaN lower portion which was varied from approximately 380 to 460 nm 2610A-2610E. The nanowire structure included a n-GaN segment 110, an quantum structure 120-140 that included ten vertically aligned InGaN/AlGaN quantum dots 120, 130, and a 30 nm p-GaN layer 150 with a hexagonally pyramid-like top. The quantum dots structure included multiple layers of InGaN 120 and AlGaN 130, that were surrounded with an Al-rich GaN shell 140 substantially similar to the nanowire illustrated in FIG. 1.

For the plots in FIG. 26, the photoluminescence emission spectra of the InGaN nanowires wore measured at room temperature with a 405 nm wavelength laser as the excitation source. Strong emission was observed at a wavelength of approximately 510 nm with a relatively narrow spectral linewidth of approximately 6 nm for nanowire arrays with heights varying from approximately 550 to 590 nm, as illustrated in FIG. 26. In the plot the horizontal axis 2610 indicates the wavelength of emission in units of nm and the vertical axis 2610 indicates the normalized PL intensity in arbitrary units (a.u.). However, the light intensity showed a significant decrease when the nanowire height was reduced below 550 nm, accompanied by a significantly broadened linewidth. These studies show that the band edge mode and the Purcell effect depends critically on the nanowire height, in addition to the nanowire diameter and spacing.

In according with aspects, the present techniques successfully demonstrate the bottom-up synthesis of InGaN photonic molecules with precisely controlled size, spacing, and morphology, which can serve as the fundamental building blocks of a new generation of photonic crystal devices and systems. By coupling the light emission into the band edge mode of InGaN nanowire structures, significantly enhanced emission efficiency and reduced spectral broadening was measured. Moreover, the luminescence emission exhibits remarkable stability. There are virtually no variations in the emission characteristics, in terms of both the emission wavelength peak, and also the spectral linewidth, in the temperature range of 5 to 300° K. and for pumping power variations from 29 to 17.5 kW/cm$^2$. To our knowledge, this is the first demonstration of the absence of quantum-confined Stark effect and Varshni's effect in InGaN light emitters. These unique characteristics, together with the scalable band edge optical mode, high light extraction efficiency, on-demand beam characteristics, and full-color emission, render bottom-up GaN nanowire photonic crystals well suited for ultrahigh efficiency, large area LED and laser devices as well as integrated nanophotonic circuits in the ultraviolet and visible spectral range.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A device comprising:
one or more clusters of nanowires wherein the nanowires have a predetermined spacing configured to generate a Purcell enhancement, the nanowires including;
a first portion including a group III-V compound semiconductor with a first type of doping;
a second portion disposed on the first portion, the second portion including a plurality of quantum core structures and a quantum shell structure disposed directly on and surrounding the plurality of quantum core structures, wherein the plurality of quantum core structures include a plurality of active regions alternating with a plurality of quantum barrier regions, wherein the plurality of quantum active regions comprise Indium Gallium Nitride (InGaN) and the plurality of quantum barrier regions and the quantum shell structure comprise Aluminum Gallium Nitride (AlGaN) having a higher concentration of Aluminum in the quantum shell region than the plurality of quantum barrier regions; and
a third portion disposed on the second portion opposite the first portion, the third portion including a group III-V compound semiconductor with a second type of doping.

2. The device of claim 1, wherein a cross-sectional width of the nanowires is further configured to generate the Purcell enhancement.

3. The device of claim 1, wherein the nanowires have a predetermined cross-sectional shape.

4. The device of claim 1, wherein the spacing between nanowires is about 20-60 nanometers (nm).

5. The device of claim 1, wherein a height of the nanowires is further configured to generate the Purcell enhancement.

6. The device of claim 1, wherein the quantum core structures include one or more quantum disks, quantum arch-shaped forms, quantum wells, quantum dots within quantum wells or combinations thereof.

7. The device of claim 1, wherein:
the first portion including the group III-V compound semiconductor with a first type of doping includes n-type doped Gallium Nitride (GaN); and the third portion including the group III-V compound semiconductor with a second type of doping includes p-type doped Gallium Nitride (GaN).

8. The device of claim 1, wherein the predetermined spacing of the nanowires is configured to generate a Purcell enhancement factor of 3.

9. The device of claim 1, further comprising:
a substrate, wherein the first portion including the group III-V compound semiconductor with the first type of doping is disposed on the substrate.

10. The device of claim 9, wherein the substrate comprises a Silicon Carbide (SiC) substrate, a Gallium Nitride (GaN) substrate, a Silicon Oxide (SiOx) substrate, a Sapphire substrate, an Aluminum Oxide (AlOx) substrate, a quartz substrate, a metal substrate, or a combination thereof.

11. The device of claim 9, further comprising:
an optically transmissive insulator layer disposed about the nanowires;
a first contact disposed on the one or more clusters of nanowires and the optically transmissive insulator layer opposite the substrate, wherein the first contact is electrically coupled to the one or more clusters of nanowires; and
a second contact disposed on the substrate opposite the one or more clusters of nanowires, wherein the first contact is electrically coupled to the one or more clusters of nanowires through the substrate.

12. The device of claim 11, further comprising:
a nano-pattern layer including one or more clusters of openings, wherein the nanowires are disposed on the substrate through the openings in the nano-pattern layer.

13. The device of claim 12, wherein a cross-sectional shape of the nanowires corresponds to a cross-sectional shape of the opening in the nano-pattern layer.

14. The device of claim 12, wherein the nano-pattern layer includes Titanium (Ti), Silicon Nitride (SiNx), or Silicon Oxide (SiOx).

* * * * *